(12) United States Patent
Uno

(10) Patent No.: US 10,771,011 B2
(45) Date of Patent: Sep. 8, 2020

(54) CIRCUIT DEVICE, OSCILLATOR, ELECTRONIC APPARATUS, AND VEHICLE

(71) Applicant: SEIKO EPSON CORPORATION, Tokyo (JP)

(72) Inventor: Tomohiro Uno, Chino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 16/391,460

(22) Filed: Apr. 23, 2019

(65) Prior Publication Data

US 2019/0326855 A1    Oct. 24, 2019

(30) Foreign Application Priority Data

Apr. 24, 2018 (JP) ................. 2018-082716

(51) Int. Cl.
*H03B 5/04* (2006.01)
*H03B 5/36* (2006.01)
*H03L 1/02* (2006.01)

(52) U.S. Cl.
CPC ............... *H03B 5/04* (2013.01); *H03B 5/362* (2013.01); *H03B 5/368* (2013.01); *H03L 1/023* (2013.01); *H03L 1/028* (2013.01); *H03B 2200/004* (2013.01); *H03B 2200/0008* (2013.01)

(58) Field of Classification Search
CPC . H03B 5/362; H03B 5/36; H03B 5/04; H03B 5/368; H03B 1/02; H03L 1/022; H03L 1/023; H03L 1/025; H03L 1/026; H03L 1/028
See application file for complete search history.

(56) References Cited

U.S. PATENT DOCUMENTS

| | | | | | |
|---|---|---|---|---|---|
| 5,977,839 | A | * | 11/1999 | Tsumura | H03L 1/025 331/66 |
| 7,436,227 | B2 | * | 10/2008 | Thomsen | H03L 1/022 327/147 |
| 9,092,730 | B2 | * | 7/2015 | Esterline | G06N 3/04 |
| 9,537,448 | B2 | | 1/2017 | Fukuzawa | |
| 2017/0141727 | A1 | * | 5/2017 | Fukuzawa | H03B 5/368 |
| 2017/0194966 | A1 | * | 7/2017 | Yonezawa | H03B 5/362 |

FOREIGN PATENT DOCUMENTS

| | | |
|---|---|---|
| JP | H01-265707 A | 10/1989 |
| JP | H03-030518 A | 2/1991 |
| JP | 2013-146114 A | 7/2013 |
| JP | 2016-144125 A | 8/2016 |
| JP | 2017-123631 A | 7/2017 |

* cited by examiner

*Primary Examiner* — Ryan Johnson
(74) *Attorney, Agent, or Firm* — Oliff PLC

(57) ABSTRACT

A circuit device includes a control voltage input terminal to which a control voltage is inputted, an A/D conversion circuit A/D-converting the control voltage to generate control voltage data and A/D-converting a temperature detection voltage from a temperature sensor to generate temperature detection data, a processing circuit generating temperature compensation data of an oscillation frequency based on the temperature detection data and performing addition processing of the temperature compensation data and the control voltage data to generate frequency control data of the oscillation frequency, and an oscillation signal generation circuit generating an oscillation signal of the oscillation frequency set by the frequency control data, using the frequency control data and a resonator.

15 Claims, 13 Drawing Sheets

CIRCUIT DEVICE, OSCILLATOR, ELECTRONIC APPARATUS, AND VEHICLE

The present application is based on, and claims priority from JP Application Serial Number 2018-082716, filed Apr. 24, 2018, the disclosure of which is hereby incorporated by reference herein in its entirety.

BACKGROUND

1. Technical Field

The present disclosure relates to a circuit device, an oscillator, electronic apparatus, a vehicle and the like.

2. Related Art

In related art, oscillators such as temperature compensated crystal oscillator (TCXO) and oven controlled crystal oscillator (OCXO) are known. For example, JP-A-2013-146114 discloses a temperature compensated crystal oscillator which realizes an automatic frequency control (AFC) function by inputting an analog control voltage to an AFC circuit. In JP-A-2013-146114 and JP-A-2017-123631, when a control voltage other than a reference voltage is input to the AFC circuit, since a value of an equivalent capacitance on an oscillation circuit side changes, a configuration is disclosed in which an auxiliary second temperature voltage generation circuit is provided for correction thereof.

In addition, for example, JP-A-2017-123631 discloses a circuit device which generates a low noise clock signal by disposing a terminal for a digital I/F and a terminal for a clock signal output along different sides, respectively.

JP-A-2013-146114 and JP-A-2017-123631 are examples of the related art.

However, even when the configuration is disclosed in which the second temperature voltage generation circuit is provided according to the present disclosure described in JP-A-2013-146114, there is a case in which a correction error which cannot be ignored occurs due to a variation in an analog circuit or the like, so that there is a problem of not obtaining high precision frequency-temperature characteristics to a sufficient degree.

Further, in a circuit disposition of the circuit device described in JP-A-2017-123631, there is a problem in which a delay in data transfer between an A/D conversion unit and a processing unit and a delay in data transfer between the processing unit and an oscillation circuit may increase.

SUMMARY

An advantage of some aspects of the present disclosure is to solve any or at least a part of the problems described above, and the present disclosure can be implemented as the following forms or aspects.

An aspect of the present disclosure relates to a circuit device including a control voltage input terminal to which a control voltage is inputted, an A/D conversion circuit A/D-converting the control voltage to generate control voltage data and A/D-converting a temperature detection voltage a temperature sensor to generate temperature detection data, a processing circuit generating temperature compensation data of an oscillation frequency based on the temperature detection data and performing addition processing of the temperature compensation data and the control voltage data to generate frequency control data of the oscillation frequency, and an oscillation signal generation circuit generating an oscillation signal of the oscillation frequency set by the frequency control data, using the frequency control data and a resonator.

In the circuit device according to the aspect of the present disclosure, the processing circuit may perform correction processing on addition result data of the addition processing and output the frequency control data after the correction processing, and the oscillation signal generation circuit may include a D/A conversion circuit D/A-converting the frequency control data after the correction processing and outputting a capacitance control voltage, a variable capacitor of which a capacitance may be controlled based on the capacitance control voltage, and an oscillation circuit oscillating the resonator with the capacitance of the variable capacitor as a load capacitance to generate the oscillation signal.

In the circuit device according to the aspect of the present disclosure, the processing circuit may perform conversion processing on the addition result data of the addition processing and output division ratio data as the frequency control data after the conversion processing, and the oscillation signal generation circuit may include an oscillation circuit oscillating the resonator to generate a second oscillation signal and a fractional-N type PLL circuit having a dividing circuit in which a division ratio may be set based on the division ratio data, comparing phases of a frequency division clock signal from the dividing circuit and the second oscillation signal, and generating the oscillation signal.

In the circuit device according to the aspect of the present disclosure, the circuit device may have a first side, a second side opposite to the first side, a third side crossing the first side, and a fourth side opposite to the third side. When a direction from the first side to the second side is defined as a first direction and a direction from the third side to the fourth side is defined, as a second direction, the oscillation signal generation circuit may be disposed on the first direction side of the A/D conversion circuit, the processing circuit may be disposed on the second direction side of the A/D conversion circuit and the oscillation signal generation circuit, the A/D conversion circuit may be disposed at a position having a shorter distance from the first side compared to a distance from the second side, and the oscillation signal generation circuit may be disposed at a position having a shorter distance from the second side compared to a distance from the first side.

In the circuit device according to the aspect of the present disclosure, a power supply circuit may be disposed between the A/D conversion circuit and the oscillation signal generation circuit.

In the circuit device according to the aspect of the present disclosure, the power supply circuit may supply a first power supply voltage to the A/D conversion circuit, supply a second power supply voltage to the processing circuit, and supply a third power supply voltage to the oscillation signal generation circuit.

In the circuit device according to the aspect of the present disclosure, the circuit device may further include a memory storing data to be used by the processing circuit, and the memory may be disposed between the processing circuit and the fourth side.

In the circuit device according to the aspect of the present disclosure, the circuit device may further include a digital interface terminal electrically coupled to the processing circuit, and the digital interface terminal may be disposed between the processing circuit and the fourth side In the circuit device according to the aspect of the present disclosure, the circuit device may further include a buffer circuit buffering the oscillation signal and outputting the oscillation signal to an outside, and when an opposite direction of the second direction is defined as a third direction, the buffer circuit may be disposed on the third direction side of the oscillation signal generation circuit.

In the circuit device according to the aspect of the present disclosure, the circuit device may further include an oven control circuit controlling a temperature of the resonator, and when an opposite direction of the second direction is defined as a third direction, the oven control circuit may be disposed on the third direction side of the A/D conversion circuit.

In the circuit device according to the aspect of the present disclosure, the circuit device may further include a PLL circuit generating and outputting a clock signal obtained by multiplying the oscillation signal, and when an opposite direction of the second direction is defined as a third direction, the PLL circuit may be disposed on the third direction side of the A/D conversion circuit.

Another aspect of the present disclosure relates to a circuit device including an A/D conversion circuit A/D-converting a temperature detection voltage from a temperature sensor to output temperature detection data, a processing circuit performing temperature compensation processing of an oscillation frequency based on the temperature detection data to generate and output frequency control data of the oscillation frequency, and an oscillation signal generation circuit generating an oscillation signal of the oscillation frequency set by the frequency control data, using the frequency control data and a resonator. The circuit device has a first side, a second side opposite to the first side, a third side crossing the first side, and a fourth side opposite to the third side. When a direction from the first side to the second side is defined as a first direction and a direction from the third side to the fourth side is defined as a second direction, the oscillation signal generation circuit is disposed on the first direction side of the A/D conversion circuit, the processing circuit is disposed on the second direction side of the A/D conversion circuit and the oscillation signal generation circuit, the A/D conversion circuit is disposed at a position having a shorter distance from the first side compared to a distance from the second side, and the oscillation signal generation circuit is disposed at a position having a shorter distance from the second side compared to a distance from the first side.

Another aspect of the present disclosure relates to an oscillator including the circuit device described above and the resonator.

Another aspect of the present disclosure relates to an electronic apparatus including a circuit device as described above.

Another aspect of the present disclosure relates to a vehicle including the circuit device as described above.

DESCRIPTION OF EXEMPLARY EMBODIMENTS

Hereinafter, preferred embodiments of the present disclosure will be described in detail. Note that the present embodiments described below do not unduly limit the contents of the present disclosure described in the appended and all of the configurations described in present embodiments are not indispensable as means for solving the present disclosure.

1. Configuration of Circuit Device

Figure 1:
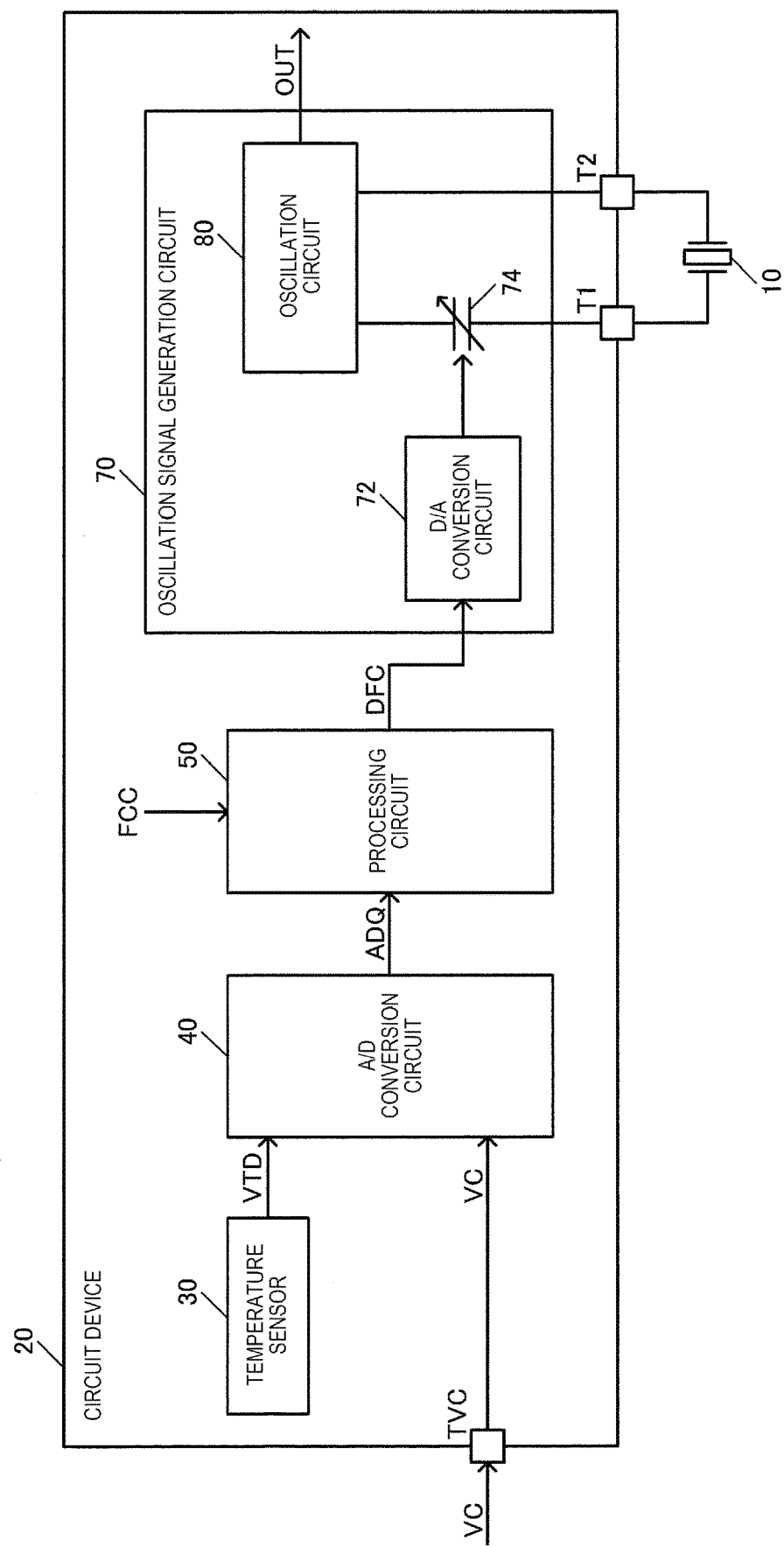
FIG. 1 is a first configuration example of a circuit device of a present embodiment.

FIG. 1 shows a first configuration example of circuit device 20 of a present embodiment. The circuit device 20 which is an integrated circuit device includes a control voltage input terminal TVC, an A/D conversion circuit 40, a processing circuit 50, and an oscillation signal generation circuit 70. The circuit device 20 can also include a temperature sensor 30. Although the temperature sensor 30 is incorporated in the circuit device 20 in FIG. 1, the temperature sensor 30 may be provided outside the circuit device 20. In this case, the circuit device 20 may be provided with a temperature detection voltage input terminal (not shown) to which a temperature detection voltage VTD from the external temperature sensor 30 is input. Alternatively, a configuration may be provided in which such a temperature detection voltage input terminal may be provided and the temperature sensor 30 may be incorporated in the circuit device 20.

A control voltage VC is input to the control voltage input terminal TVC. The control voltage input terminal TVC can be realized by a pad of the circuit device 20. The control voltage VC is a voltage for controlling an oscillation frequency of an oscillation signal OUT generated by the oscillation signal generation circuit 70 and is input to the circuit device 20 from an external controller or the like.

The temperature sensor 30 outputs a temperature dependent voltage which changes according to a temperature of an environment, as the temperature detection voltage VTD. The temperature of the environment is the temperature of the environment surrounding, for example, the circuit device 20 and a resonator 10. For example, the temperature sensor 30 generates the temperature dependent voltage using a circuit element having temperature dependency, and outputs the temperature dependent voltage based on a temperature independent voltage. For example, the temperature sensor 30 outputs a forward voltage of a PN junction as the temperature dependent voltage. The temperature independent voltage is, for example, a bandgap reference voltage or the like.

The A/D conversion circuit 40 generates control voltage data by A/D conversion of the control voltage VC. Further, the A/D conversion circuit 40 A/D-converts the temperature detection voltage VTD from the temperature sensor 30 to generate temperature detection data. The control voltage data and the temperature detection data are output from the A/D conversion circuit 40 as A/D conversion data ADQ. The A/D conversion circuit 40 may perform the A/D conversion of the control voltage VC and the A/D conversion of the temperature detection voltage VTD in a time division manner. Alternatively, a first A/D converter and a second A/D converter may be provided in the A/D conversion circuit 40, the A/D conversion of the control voltage VC may be performed by the first A/D converter, and the A/D conversion of the temperature detection voltage VTD may be performed by the second A/D converter. As an A/D conversion method of the A/D conversion circuit 40, for example, a successive approximation type, a delta sigma type, a flash type, a pipeline type, a double integral type or the like can be adopted.

The processing circuit 50 is a circuit that performs various digital signal processing. For example, the processing circuit 50 is a DSP that performs digital signal processing such as temperature compensation processing, aging correction processing, or digital filter processing. For example the processing circuit 50 can be realized by a processor such as a DSP and a CPU, or can be realized by an ASIC circuit by automatic placement and routing such as a gate array.

For example, the processing circuit 50 performs various digital signal processing by a program running on the processor.

The processing circuit 50 of the present embodiment performs temperature compensation of an oscillation frequency based on the temperature detection data to generate frequency control data DFC of the oscillation frequency. Specifically, the processing circuit 50 generates temperature compensation data of the oscillation frequency based on the temperature detection data. Then, the processing circuit 50 performs addition processing of the temperature compensation data and the control voltage data, to generate the frequency control data DFC of the oscillation frequency. The frequency control data DFC is also called a frequency control code. That is, the processing circuit 50 performs the temperature compensation processing of the oscillation frequency based on the temperature detection data inputted as the A/D conversion data ADQ from the A/D conversion circuit 40. The temperature compensation processing is a compensation processing for making the oscillation frequency constant with respect to a temperature change. Further, the processing circuit 50 performs addition processing of the control voltage data inputted as A/D conversion data ADQ from the A/D conversion circuit 40, and the temperature compensation data generated by the temperature compensation processing. That is, the control voltage data and the temperature compensation data are digitally added. Then, the processing circuit 50 performs, for example, correction processing or conversion processing to be described later on addition result data of the addition processing, and outputs the frequency control data DFC to the oscillation signal generation circuit 70 after the correction processing or the conversion processing. The frequency control data DFC may be generated by inputting the frequency control code (FCC) as frequency control to the processing circuit 50. For example, the FCC is input to the processing circuit 50 from an external processing device via a digital interface of the circuit device 20. The digital interface can be realized in, for example, a serial peripheral interface (SPI), an inter-integrated circuit (I2C), or the like.

The oscillation signal generation circuit 70 is a circuit, which generates the oscillation signal OUT by using the resonator 10.

Specifically, the oscillation signal generation circuit 70 uses the frequency control data DFC and the resonator 10, and generates the oscillation signal OUT of the oscillation frequency set by the frequency control data DFC. For example, the oscillation signal generation circuit 70 oscillates the resonator 10 at the oscillation frequency set by the frequency control data DFC to generate the oscillation signal OUT.

Specifically, in the first configuration example of FIG. 1, the oscillation signal generation circuit 70 includes a D/A conversion circuit 72, a variable capacitor 74, and an oscillation circuit 80. In this first configuration example, the processing circuit 50 performs the correction processing on the addition result data of the addition processing and outputs the frequency control data DFC after the correction processing. That is, the processing circuit 50 performs the correction processing on the addition result data of the control voltage data and the temperature compensation data. This correction processing is, for example, correction processing for causing the oscillation frequency of the oscillation signal OUT to linearly change with respect to a change of the control voltage VC. The D/A conversion circuit 72 of the oscillation signal generation circuit 70 D/A-converts the frequency control data DFS after the correction processing and outputs a capacitance control voltage obtained by the D/A conversion to the variable capacitor 74. A capacitance of the variable capacitor 74 is controlled based on a capacitance limit voltage. The variable capacitor 74 is a capacitor whose capacitance value is variably controlled based on the capacitance control voltage, and can be realized by a varactor or the like which is a variable capacitance diode. The oscillation circuit 80 oscillates the resonator 10 with the capacitance of the variable capacitor 74 as a load capacitance, and generates the oscillation signal OUT.

Specifically, the circuit device 20 includes terminals T1 and T2 for coupling of the resonator 10. These terminals T1 and T2 can be realized by IC pads. The terminal T1 is coupled to one end of the resonator 10, and the terminal T2 is coupled to the other of the resonator 10. One end of the variable capacitor 74 is electrically coupled to the terminal T1. The other end of the variable capacitor 74 is grounded by the oscillation circus t 80, for example. Further, the other end of the resonator 10 is electrically coupled to the oscillation circuit 80 via the terminal T2. An electrical coupling is that a coupling is made in which an electric signal can be transmitted, and is a coupling that enables transmission of information by the electric signal. The electrical coupling may be, for example, a coupling a signal line, an active element or the like.

The resonator 10 is an element that generates mechanical resonation by an electric signal. The resonator 10 can be realized by a resonator element such as a quartz crystal resonator element, for example. For example, the resonator 10 can be realized by the quartz crystal resonator element or the like which exhibits thickness-shear resonation whose cut angle is AT cut, SC cut, or the like. For example, the resonator 10 may be a resonator built in a temperature compensated oscillator (TCXO) not equipped with a thermostatic chamber, or a resonator built in a thermostatic chamber type oscillator (OCXO) equipped with the there static chamber. Further, the resonator 10 of the present embodiment can be realized by various resonator elements such as a resonator element of a type other than the thickness-shear resonation type and a piezoelectric resonator element formed of a material other than quartz crystal. For example, a surface acoustic wave (SAW) resonator, a micro electro mechanical systems (MEMS) resonator as a silicon-based resonator formed using a silicon substrate, or the like may be adopted as the resonator 10.

The D/A conversion circuit 72 performs D/A conversion of the frequency control data DFC from the processing circuit 50 as described above. The frequency control data DFC inputted to the D/A conversion circuit 72 is frequency control data after digital signal processing such as temperature compensation processing, aging correction processing, or Kalman filter processing. As for a D/A conversion system of the D/A conversion circuit 72, for example, a resistance string type which is also called a resistance division type can be adopted. However, a D/A conversion method is not limited to the type above, and various methods such as a resistance ladder type such as R-2R, a capacitance array type, a pulse width modulation type, or the like can be adopted. In addition to the D/A converter, the D/A conversion circuit 72 may include a control circuit thereof, a modulation circuit for performing dither modulation, PWM modulation or the like, a filter circuit, or the like.

The variable capacitor 74 is realized by the varactor which is the variable capacitance diode. The capacitance of the variable capacitor 74 is variably controlled by the capacitance control voltage from the D/A conversion circuit 72.

The oscillation circuit 80 has a buffer circuit for driving the resonator 10. As for the buffer circuit, for example, a bipolar transistor or the like can be used. For example, a current source is provided between a collector of the bipolar transistor and a power supply node on a high potential side. For example, one end of the variable capacitor 74 is electrically coupled to one end of the resonator 10 via the terminal T1. The other end of the variable capacitor 74 is electrically coupled to a GND node by the oscillation circuit 80 and grounded, for example. The GND node is a ground node. A terminal T2 to which the other end of the resonator 10 is coupled is electrically coupled to, for example, a base of the bipolar transistor which is the buffer circuit of the oscillation circuit 80. In addition, the oscillation circuit 80 has a capacitor for load capacitance, one end of the capacitor is coupled to the terminal T2, and the other end of the capacitor is electrically coupled to the GND node and grounded. Further, a feedback element such as a capacitor provided between the terminal T1 and the terminal T2 may be provided in the oscillation circuit 80. A base current generated by oscillation of the resonator 10 flows between the base and an emitter of the bipolar transistor. Then, the oscillation signal OUT is generated by using a collector current flowing between the collector and the emitter of the bipolar transistor by the base current. The buffer circuit of the oscillation circuit 80 may be realized by an inverting amplifier circuit in which a node of the terminal T1 and one node of nodes of the terminal T2 serve as input nodes and the other node of the terminal T2 serves as an output node. The inverting amplifier circuit can be realized by, for example, an inverter circuit having a current control function.

Figure 2:
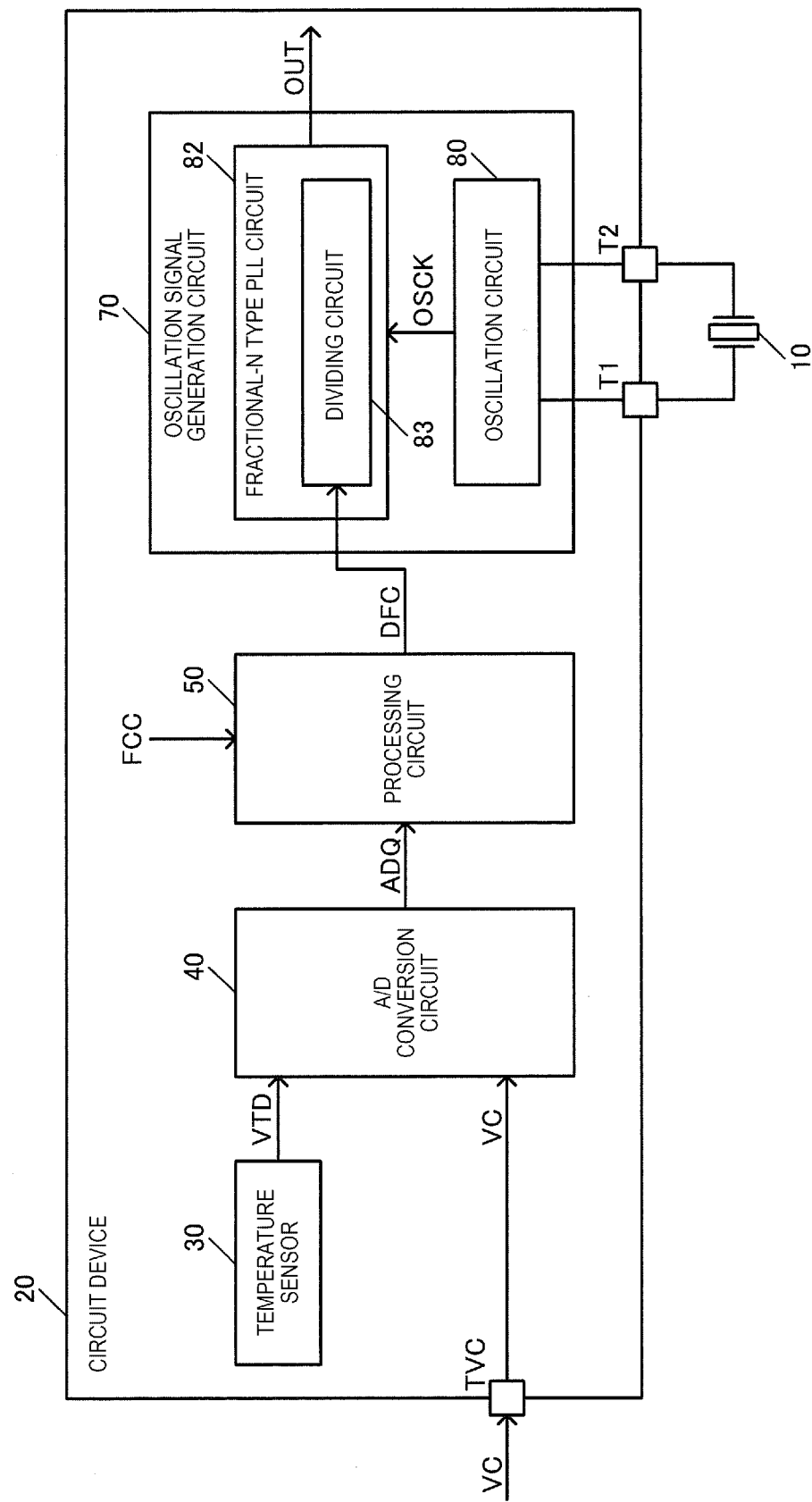
FIG. 2 is a second configuration example of the circuit device of the present embodiment.

FIG. 2 shows a second configuration example of the circuit device 20 of this present embodiment. In this second configuration example, the oscillation signal generation circuit 70 includes the oscillation circuit 80 and a fractional-N type PLL circuit 82. The oscillation circuit 80 oscillates the resonator 10 and outputs an oscillation signal OSCK. The oscillation signal OSCK is a second oscillation signal. For example, the resonator 10 is electrically coupled to the oscillation circuit 80 via the terminals T1 and T2. Then, the resonator 10 is driven by the buffer circuit provided in the oscillation circuit 80, to resonate the resonator 10 and to generate the oscillation signal OSCK which is output to the fractional-N type PLL circuit 82. The fractional-N type PLL circuit 82 has a dividing circuit 83 and compares phases of a frequency division clock signal from the dividing circuit 83 and the oscillation signal OSCK, to generate the oscillation signal OUT. For example, in FIG. 2, the processing circuit 50 performs the conversion processing on the addition result data of the addition processing and outputs the frequency control data DFC after the conversion processing. Specifically, the processing circuit 50 converts the addition result data of the control voltage data and the temperature compensation data and outputs division ratio data as the frequency control data DFC. The dividing circuit 83 of the fractional-N type PLL circuit 82 sets the division ratio based on the division ratio data which is the frequency control data DFC, and outputs the frequency division clock signal of the oscillation signal OUT according to the division ratio. The fractional-N type PLL circuit 82 generates the oscillation signal OUT by comparing the phases of the frequency division clock signal and the oscillation signal OSCK from the oscillation circuit 80.

Figure 3:
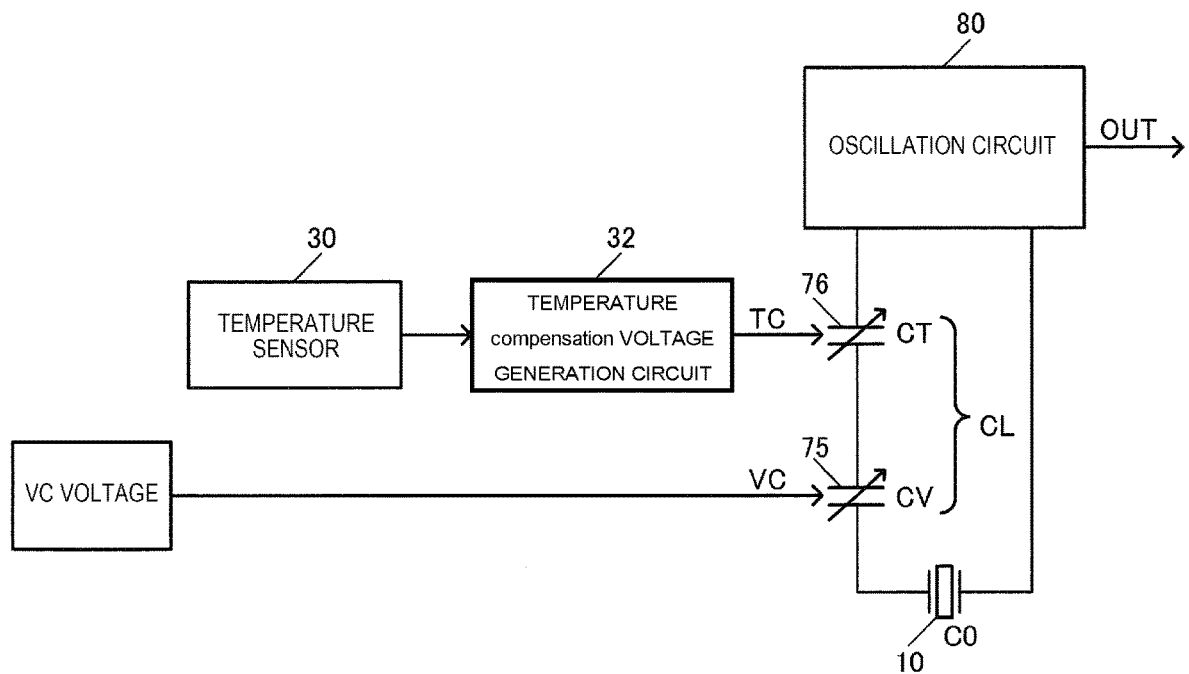
FIG. 3 is an explanatory diagram of a problem of a configuration of a comparative example.

FIG. 3 shows a configuration example of a circuit device of a comparative example. In FIG. 3, an analog control voltage VC is inputted, and a capacitance CV of a variable capacitor 75 is controlled based on the control voltage VC. Further, based on a temperature detection voltage from the temperature sensor 30, a temperature compensation voltage generation circuit 32 outputs the temperature compensation voltage TC, and a capacitance CT of a variable capacitor 76 is controlled based on the temperature compensation voltage. These capacitances CV and CT become a load capacitance CL of the oscillation circuit 80. An equivalent capacitance of the resonator 10 is set to C0.

In FIG. 3, one end of the variable capacitor 75 is coupled to one end of the resonator 10, and the other end of the variable capacitor 75 is coupled to one end of the variable capacitor 76. The other end of the variable capacitor 76 coupled to, for example, a GND node. For example, the variable capacitors 75 and 76 are coupled in series between one end of the resonator 10 and the GND node.

In the configuration of the comparative example, when a frequency adjustment (AFC) using the control voltage VC is used in combination with the temperature compensation, a correction amount of the temperature compensation is changed by the control voltage VC, and a problem of deterioration of frequency-temperature characteristics may occur. In this case, although a method may be considered in which the temperature compensation voltage is corrected while the control voltage VC is monitored, a correction error occurs, and it is difficult to realize high precision frequency-temperature characteristics.

For example, when the variable capacitor 75 for the frequency adjustment and the variable capacitor 76 for the temperature compensation are coupled in series between the resonator 10 and the GND node as shown in FIG. 3, a frequency deviation $\Delta f$ of the oscillation signal OUT can be expressed by the load capacitance CL and the equivalent capacitance C0 of the resonator 10 as shown in the following formula (1). The frequency deviation $\Delta f$ represents a deviation of an actual frequency from a nominal frequency.

$$\Delta f \propto 1/(C0+CL) \qquad (1)$$

Further, the load capacitance CL can be expressed by the following formula (2).

$$1/CL = 1/CV + 1/CT \quad (2)$$

The following formulas (3) and (4) are established according to the above formulas (1) and (2).

$$\Delta f \propto ERR \times (1/CV + 1/CT) \quad (3)$$

$$ERR = (CV \times CT)/(C0 \times CV + C0 \times CT + CV \times CT) \quad (4)$$

ERR corresponds to an error component. Further, for example, the following relationships (5) and (6) are established between the control voltage VC and the capacitance CV of the variable capacitor 75 and between the temperature compensation voltage TC and the capacitance CT of the variable capacitor 76.

$$VC \propto 1/CV \quad (5)$$

$$TC \propto 1/CT \quad (6)$$

Figure 4:
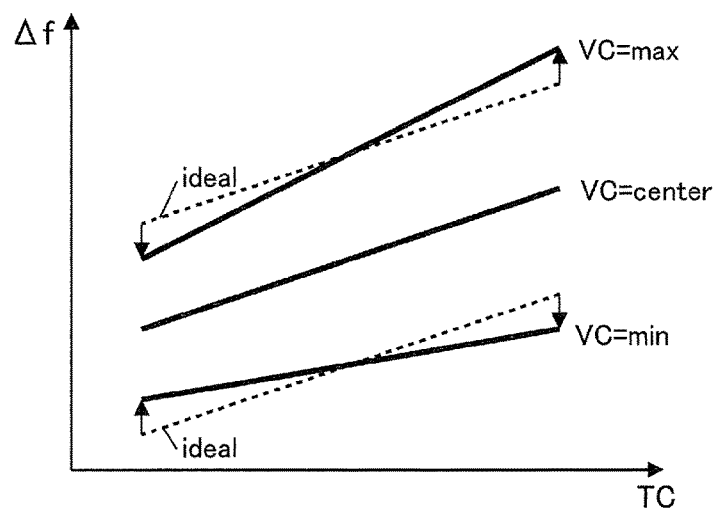
FIG. 4 is an explanatory graph of the problem of the configuration of the comparative example.

FIG. 4 shows a relationship between the temperature compensation voltage TC and the frequency deviation Δf in the configuration of the comparative example. For example, assuming that the error component ERR is a constant, the following formula (7) is established from the above formulas (3), (5), and (6).

$$\Delta f \propto ERR \times (VC + TC) \quad (7)$$

Figure 5:
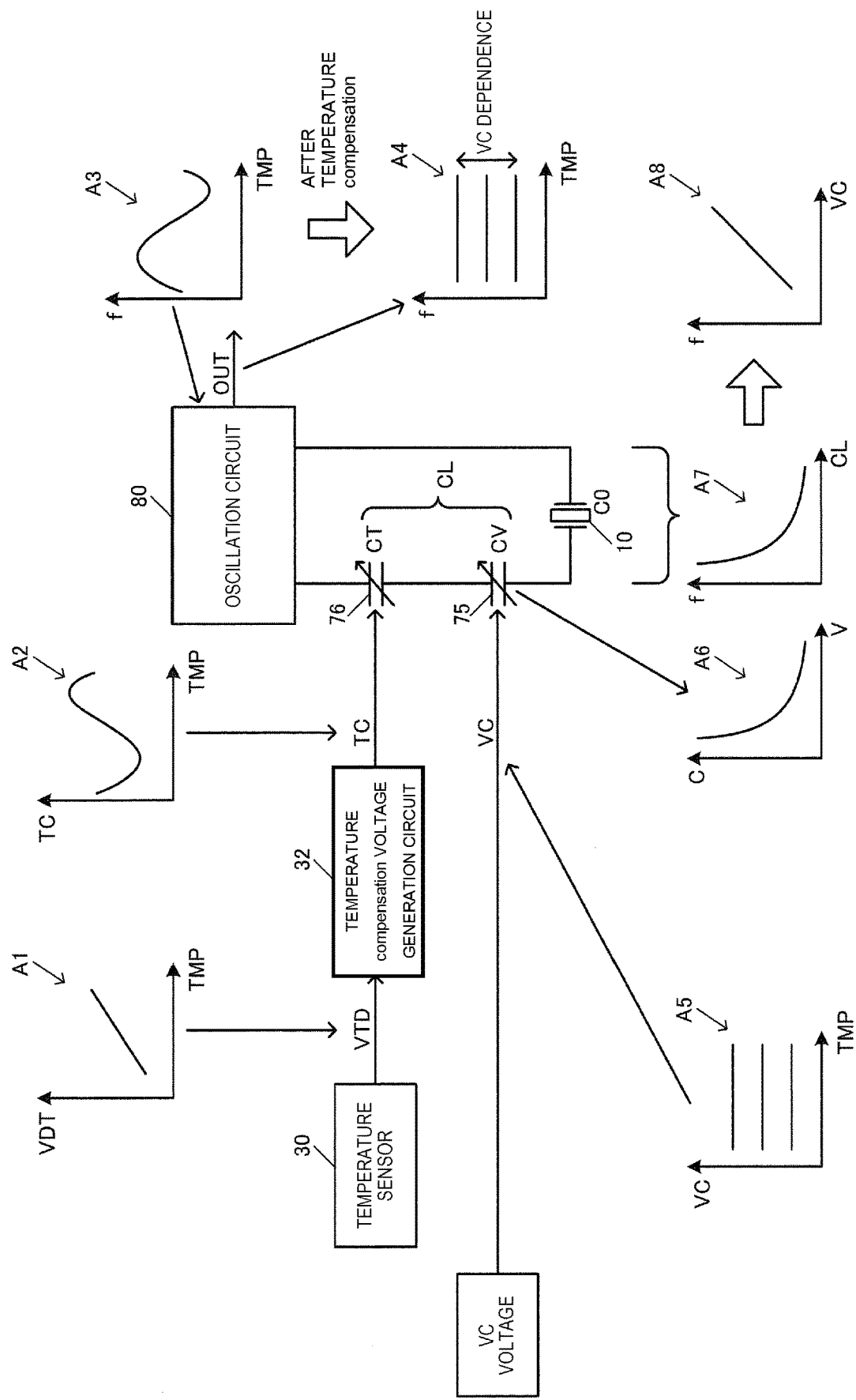
FIG. 5 is an operation explanatory diagram of the configuration of the comparative example.
Figure 6:
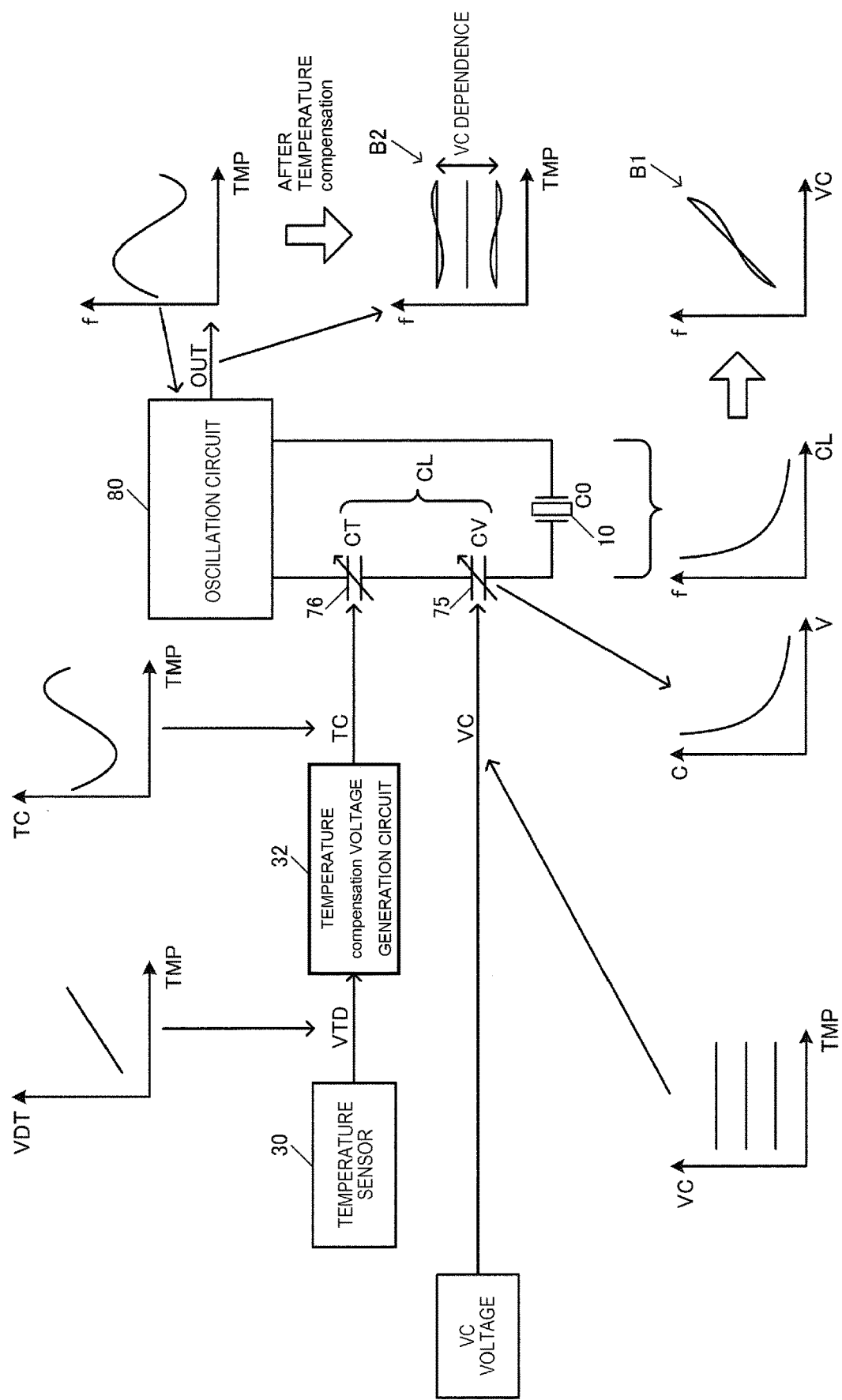
FIG. 6 is the operation explanatory diagram of the configuration of the comparative example.

Therefore, when the control voltage VC is a constant, the frequency deviation Δf is a linear function of the temperature compensation voltage TC, and a linear relationship is established between the frequency deviation Δf and the temperature compensation voltage TC. That is, in this case, the relationship between the temperature compensation voltage TC and the frequency deviation Δf is in a linear relationship as indicated by characteristics of dotted lines described as "ideal" in FIG. 4. However, in reality, the error component ERR is not a constant but a value corresponding to the capacitances CV and CT, and for example, since the capacitance CT varies according to the temperature compensation voltage TC, the error component ERR also changes according to the temperature compensation voltage TC. As a result, as shown by dotted line characteristics in FIG. 4, a deviation occurs from an ideal linear relationship. Due to the deviation from the linear relationship caused by such an error component ERR, the problem of deterioration of frequency-temperature characteristics occurs. As a second comparative example of the present embodiment, it is conceivable to provide the variable capacitor 75 for the frequency adjustment and the variable capacitor 76 for the temperature compensation in parallel, between the resonator 10 and the GND node. However, in the second comparative example, since the frequency deviation is Δf ∝ 1/(C0+CV+CT), the deviation from the ideal linear relationship is further increased as compared with the configuration of the comparative example of FIG. 3, and the frequency-temperature characteristics further deteriorate FIG. 5 and FIG. 6 are diagrams explaining in detail the problem of deterioration of the frequency-temperature characteristics in the configuration of the comparative example. The temperature detection voltage VTD from the temperature sensor 30 changes as indicated by A1 with respect to a temperature TMP. That is, the temperature detection voltage VTD is a temperature dependence voltage. The temperature compensation voltage generation circuit 32, to which the temperature detection voltage VTD is inputted, performs the temperature compensation as indicated by A2, and outputs the temperature compensation voltage TC to the variable capacitor 76. For example, when the temperature compensation is not performed, the frequency-temperature characteristics of an oscillation frequency f has characteristics as indicated by A3. The temperature compensation voltage generation circuit 32 performs the temperature compensation which cancels out the temperature dependency of the oscillation frequency f indicated by A3 by using coefficient data for the temperature compensation. Accordingly, as indicated by A4, it is possible to make the oscillation frequency f of the oscillation signal OUT constant with respect to a change of the temperature TMP.

On the other hand, the control voltage VC indicated by A5 is input to the variable capacitor 75. The capacitance CV of the variable capacitor 75 changes with respect to the control voltage VC as indicated by A6. The capacitance CT of the variable capacitor 76 also changes with respect to the temperature compensation voltage TC, exhibiting a voltage capacitance characteristic as indicated by A6. Further, the oscillation frequency f changes with respect to the load capacitance CL, exhibiting a characteristic as indicated by A7. Therefore, ideally, the oscillation frequency f changes linearly with respect to the control voltage VC as indicated by A8 in FIG. 5. That is, ideally, as indicated by A4, the oscillation frequency f can be controlled according to the control voltage VC, and the oscillation frequency f can be made constant with respect to the change of the temperature TMP.

However, in reality, due to the error component ERR described in the above formulas (3) and (4), the deviation from the ideal linear relationship occurs in the frequency deviation Δf of the oscillation frequency f as shown in FIG. 4. As a result, as indicated by B1 and B2 in FIG. 6, the relationship between the control voltage VC and the oscillation frequency f does not become the linear relationship represented by the linear function. Therefore, the change in the oscillation frequency f due to the control voltage VC does not become a linear change as indicated by A8 of FIG. 5, and the frequency-temperature characteristics deteriorate. That is, when the control voltage VC is changed, a frequency deviation as indicated by B2 in FIG. 6 occurs, and there is a problem that the high precision frequency-temperature characteristics cannot be realized.

On the other hand, according to the circuit device 20 of the present embodiments shown in FIGS. 1 and 2, the analog control voltage VC inputted from the outside is A/D-converted into the digital control voltage data by the A/D conversion circuit 40. In addition, the temperature detection voltage VTD from the temperature sensor 30 is also A/D-converted into the digital temperature detection data by the A/D conversion circuit 40. Then, the processing circuit 50 generates the temperature compensation data of the oscillation frequency based on the temperature detection data, performs the addition processing of the temperature compensation data and the control voltage data, and generates the frequency control data DFC. Finally, the oscillation signal OUT of the oscillation frequency set by the frequency control data DFC is generated.

According to the circuit device 20 of the present embodiment having such a configuration, it is unnecessary to separately provide the variable capacitor 75 for the frequency adjustment and the variable capacitor 76 for the temperature compensation as shown in the comparative example of FIGS. 5 and 6. Therefore, an occurrence of a frequency error as indicated by B1 and B2 of FIG. 6 can be suppressed, and the high precision frequency-temperature characteristics can be realized. That is, according to the circuit device 20 of the present embodiment, the temperature compensation data and the control voltage data are digitally added in the processing circuit 50 to generate the frequency control data DFC, and the oscillation signal OUT of the oscillation frequency set by the frequency control data DFC is generated by the oscillation signal generation circuit 70. Therefore, even if the variable capacitors 75 and 76 are not separately provided as shown in FIGS. 5 and 6, it is possible to perform the frequency adjustment and the temperature compensation by the control voltage VC, and it is possible to generate the oscillation signal OUT with the high precision frequency-temperature characteristics. Further, according to the circuit device 20 of the present embodiment, it is possible to have coexistence of the frequency adjustment function by the analog control voltage VC with the digital temperature compensation. For example, even when the external processing device performs the frequency adjustment using the analog control voltage VC instead of the digital FCC, it is possible to handle this case, and convenience can be improved.

Specifically, in the first configuration example of FIG. 1, the addition processing of the temperature compensation data and the control voltage data is performed to generate the frequency control data DFC, the frequency control data DFC is D/A-converted to obtain the capacitance control voltage, thereby the capacitance of the variable capacitor 74 is controlled, and an oscillation signal OUT is generated. Therefore, as shown in FIGS. 5 and 6, it is unnecessary to separately provide the variable capacitor 75 for the frequency adjustment and the variable capacitor 76 for the temperature compensation, and only one variable capacitor 74 needs to be provided. This one capacitance of the variable capacitor 74 is controlled by the capacitance control voltage, and the oscillation frequency of the oscillation circuit 80 is adjusted. Therefore, problems as indicated by B1 and B2 of FIG. 6 do not occur, and it is possible to generate the oscillation signal OUT with the high precision frequency-temperature characteristics.

In the second configuration example of FIG. 2, the addition processing of the temperature compensation data and the control voltage data is performed, and the division ratio data is generated as the frequency control data DFC. The division ratio of the dividing circuit 83 is set by the division ratio data to generate the frequency division clock signal, and the oscillation signal OUT is generated by the fractional-N type PLL circuit 82 based on the oscillation signal OSCK and the frequency division clock signal. Accordingly, even if the variable capacitors 75 and 76 as shown in FIGS. 5 and 6 are not provided, it is possible to generate the oscillation signal OUT with high precision frequency-temperature characteristics, in which the frequency adjustment by the control voltage VC and the temperature compensation by the temperature sensor 30 are both performed.

Figure 7:
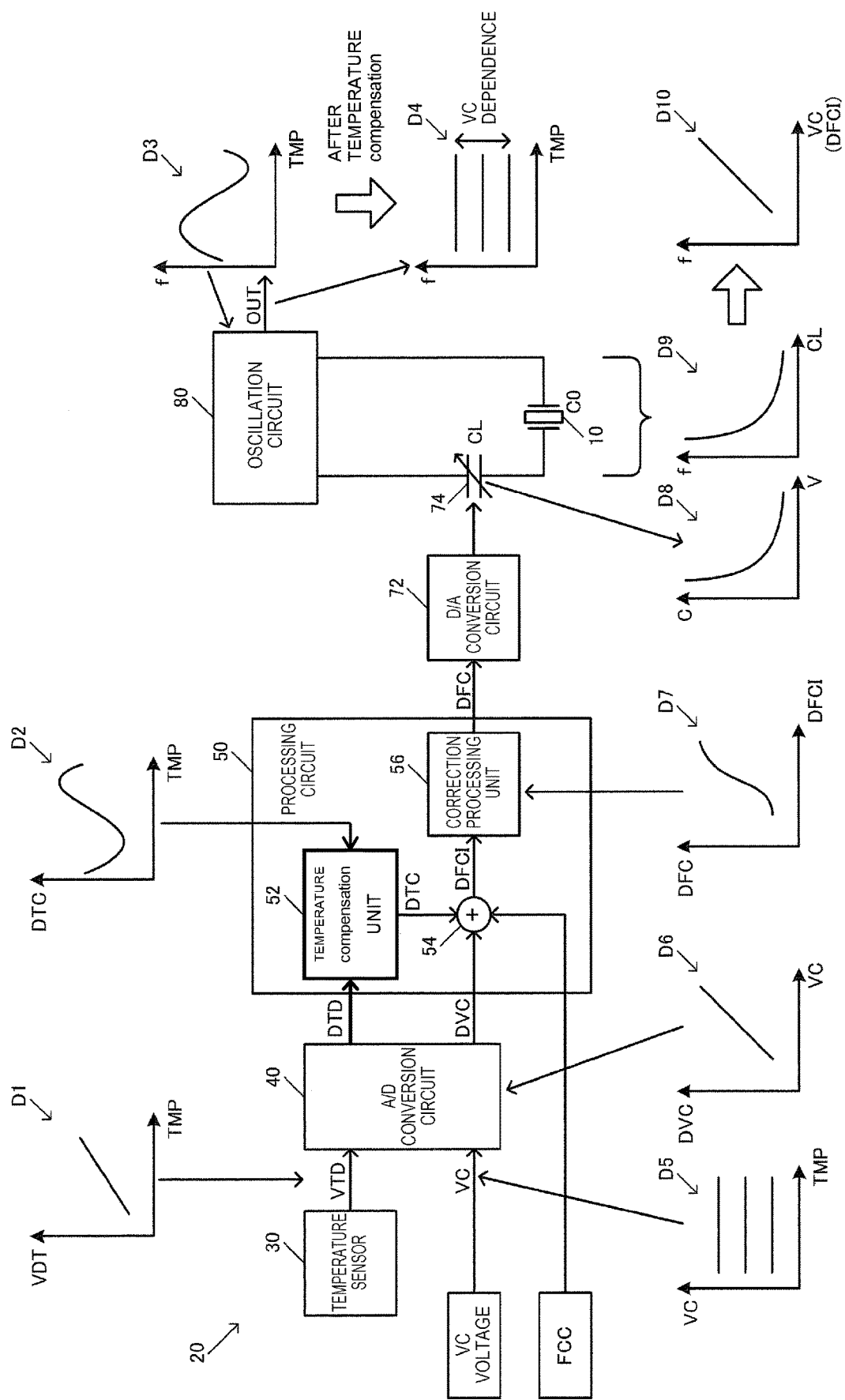
FIG. 7 is an operation explanatory diagram of the first configuration example of the present embodiment.

FIG. 7 is a detailed operation explanatory diagram of the first configuration example of FIG. 1. In FIG. 7, the processing circuit 50 includes a temperature compensation unit 52, an adder 54, and a correction processing unit 56. The temperature compensation unit 52 performs the temperature compensation processing based on temperature detection data DTD from the A/D conversion circuit 40, and generates and outputs the temperature compensation data DTC. The adder 54 performs addition processing of control voltage data DVC from the A/D conversion circuit 40 and the temperature compensation data DTC from the temperature compensation unit 52, and outputs the addition result data DFCI to the correction processing unit 56. The correction processing unit 56 performs correction processing for making a relationship of the oscillation frequency f with respect to the control voltage VC linear. The frequency control data DFC after the correction processing is input to the D/A conversion circuit 72, and the load capacitance CL which is the capacitance of the variable capacitor 74 is controlled based on the capacitance control voltage from the D/A conversion circuit 72.

Specifically, the temperature detection voltage VTD from the temperature sensor 30 changes as indicated by D1 with respect to the temperature TMP. This temperature detection voltage VTD is A/D-converted into the temperature detection data DTD by the AID conversion circuit 40. The temperature compensation unit 52, to which the temperature detection data DTD is inputted, performs the temperature compensation processing as indicated by D2, and generates the temperature compensation data DTC. Specifically, the temperature compensation unit 52 performs the temperature compensation which cancels out the temperature dependency of the oscillation frequency f indicated by D3, by using the coefficient data for the temperature compensation. Accordingly, as indicated by D4, it is possible to make the oscillation frequency f of the oscillation signal OUT constant, with respect to the change of the temperature TMP.

On the other hand, the control voltage VC indicated by D5 is A/D-converted into the control voltage data DVC by the A/D conversion circuit 40 as indicated by D6. The adder 54 performs addition processing of the control voltage data DVC and the temperature compensation data DTC from the temperature compensation unit 52, and outputs the addition result data DFCI. The correction processing unit 56 performs the correction processing on the addition result data DFCI as indicated by D7. Specifically, the correction processing unit 56 performs the correction processing so as to make the relationship of the oscillation frequency f with respect to the control voltage VC linear, and outputs the frequency control data DFC after the correction processing. Then, the D/A conversion circuit 72 performs the D/A conversion of the frequency control data DFC and outputs the capacitance control voltage to the variable capacitor 74.

The load capacitance CD which is the capacitance of the variable capacitor 74 changes with respect to the capacitance control voltage from the D/A conversion circuit 72, exhibiting a characteristic as indicated by D8. Further, the oscillation frequency f changes with respect to the load capacitance CL, exhibiting the characteristic as indicated by D9. Accordingly, as indicated by D10, the oscillation frequency f changes linearly with respect to the control voltage VC. As a result, as indicated by D4, the oscillation frequency f can be controlled according to the control voltage VC, and the oscillation frequency f can be made constant with respect to the change of the temperature TMP.

Figure 8:
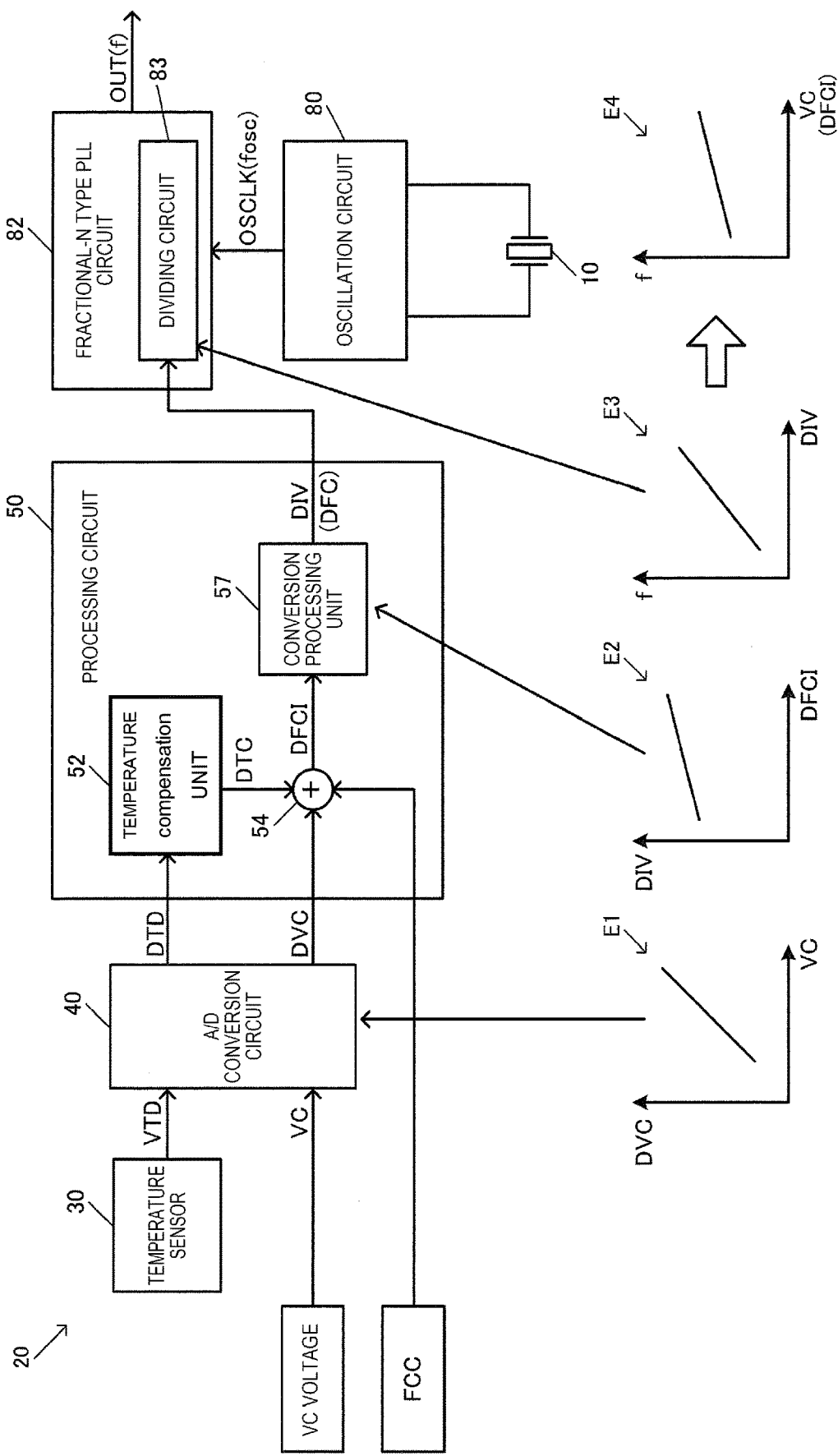
FIG. 8 is an operation explanatory diagram of the second configuration example of the present embodiment.

FIG. 8 is a detailed operation explanatory diagram of the second configuration example of FIG. 2. In FIG. 8, the processing circuit 50 includes a temperature compensation unit 52, an adder 54, and a conversion processing unit 57. The temperature compensation unit 52 performs the temperature compensation processing on the temperature detection data DTD from the A/D conversion circuit 40, and generate: and outputs the temperature compensation data DTC. The adder 54 performs addition processing of the control voltage data DVC from the A/D conversion circuit 40 and the temperature compensation data DTC from the temperature compensation unit 52, and outputs the addition result data DFCI to the conversion processing unit 57. The conversion processing unit 57 performs the conversion processing on the addition result data DFCI and outputs division ratio data DIV as the frequency control data DFC after the conversion processing. The division ratio based on the division ratio data DIV is set in the dividing circuit 83 of the fractional-N type PLL circuit 82. Then, the fractional-N type PLL circuit 82 performs phase comparison between the frequency division clock signal from the dividing circuit 83 and the oscillation signal OSCK from the oscillation circuit 80, and generates the oscillation signal OUT.

Specifically, the control voltage VC indicated by E1 is A/D-converted to the control voltage data DVC by the A/D conversion circuit 40 as indicated by E2. The adder 54 performs addition processing of the control voltage data DVC and the temperature compensation data DTC from the temperature compensation unit 52, and outputs the addition result data DFCI. The conversion processing unit 57 performs conversion processing on the addition result data DFCI as indicated by E2 and outputs division ratio data DIV as the frequency control data DFC. Then, the division ratio based on the division ratio data DIV is set in the dividing circuit 83, so that the oscillation frequency f of the oscillation signal OUT changes according to the division ratio. As a result, as indicated by E4, the oscillation frequency f can be controlled according to the control voltage VC. Further, by performing the temperature compensation by the temperature compensation unit 52, the oscillation frequency f can be made constant with respect to the change of the temperature TMP.

Figure 9:
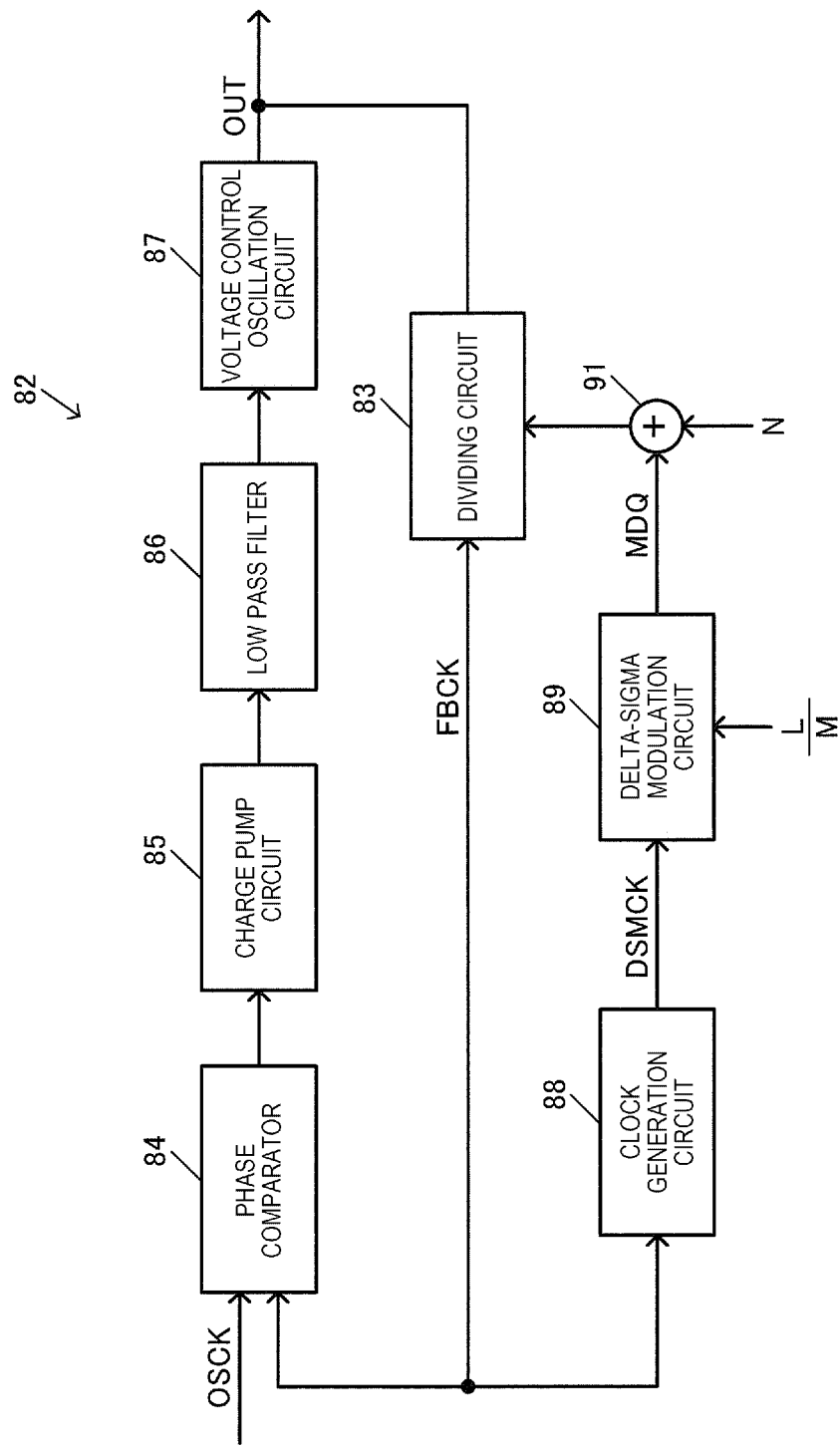
FIG. 9 shows a configuration example of fractional-N type PLL circuit.

FIG. 9 shows a configuration example of the fractional-N type PLL circuit 82. The fractional-N type PLL circuit 82 includes the dividing circuit 83, a phase comparator 84, a charge pump circuit 85, a low pass filter 86, a voltage control oscillation circuit 87, a clock generation circuit 88, a delta-sigma modulation circuit 89, and an addition and subtraction circuit 91. The phase comparator 84 compares phases of the oscillation signal OSCK which is the second oscillation signal from the oscillation circuit 80, and a frequency division clock signal FBCK from the dividing circuit 83. The charge pump circuit 85 converts a pulse voltage outputted by the phase comparator 84 into a current. The low pass filter 86 smooths the current outputted by the charge pump circuit 85 and converts the current into a voltage. The voltage control oscillation circuit 87 outputs the oscillation signal OUT in which an output voltage of the low pass filter 86 is a control voltage and the control voltage sets the oscillation frequency.

The dividing circuit 83 performs integer division on the oscillation signal OUT outputted from the voltage control oscillation circuit 87, using an output signal of the addition and subtraction circuit 91 as an integer division ratio, and outputs the frequency division clock signal FBCK.

The clock generation circuit 88 generates and outputs a clock signal DSMCK using the frequency division clock signal FBCK. For example, the clock generation circuit 88 may buffer the frequency division clock signal FBCK and output the clock signal DSMCK therefrom, or may output the clock signal DSMCK obtained by integer-dividing the frequency division clock signal FBCK.

The delta-sigma modulation circuit 89 synchronizes with the clock signal DSMCK from the clock generation circuit 88, and performs delta-sigma modulation in which a fractional division ratio L/M is integrated and quantized. The addition and subtraction circuit 91 adds and subtracts a delta sigma modulation signal DMQ outputted from the delta-sigma modulation circuit 89, and the integer division ratio N. An output signal of the addition and subtraction circuit 91 is input to a dividing circuit 83. In the output signal of the addition and subtraction circuit 91, a plurality of integer division ratios in a range around the integer division ratio N change in time series, and a time average value thereof coincides with N+L/M. N+L/M is set by the division ratio data DIV from the processing circuit 50. For example, the oscillation frequency of the oscillation signal OUT is defined as f, and an oscillation frequency of the oscillation signal OSCK is defined as fosc. In this case, in a steady state in which a phase of the oscillation signal OSCK and a phase of the frequency division clock signal FBCK are synchronized, the following formula (8) is established.

$$f=(N+L/M) \times fosc \tag{8}$$

By using the fractional-N type PLL circuit 82 having such a configuration, the oscillation signal OUT obtained by multiplying the oscillation signal OSCK by a division ratio expressed by N+L/M can be generated.

Figure 10:
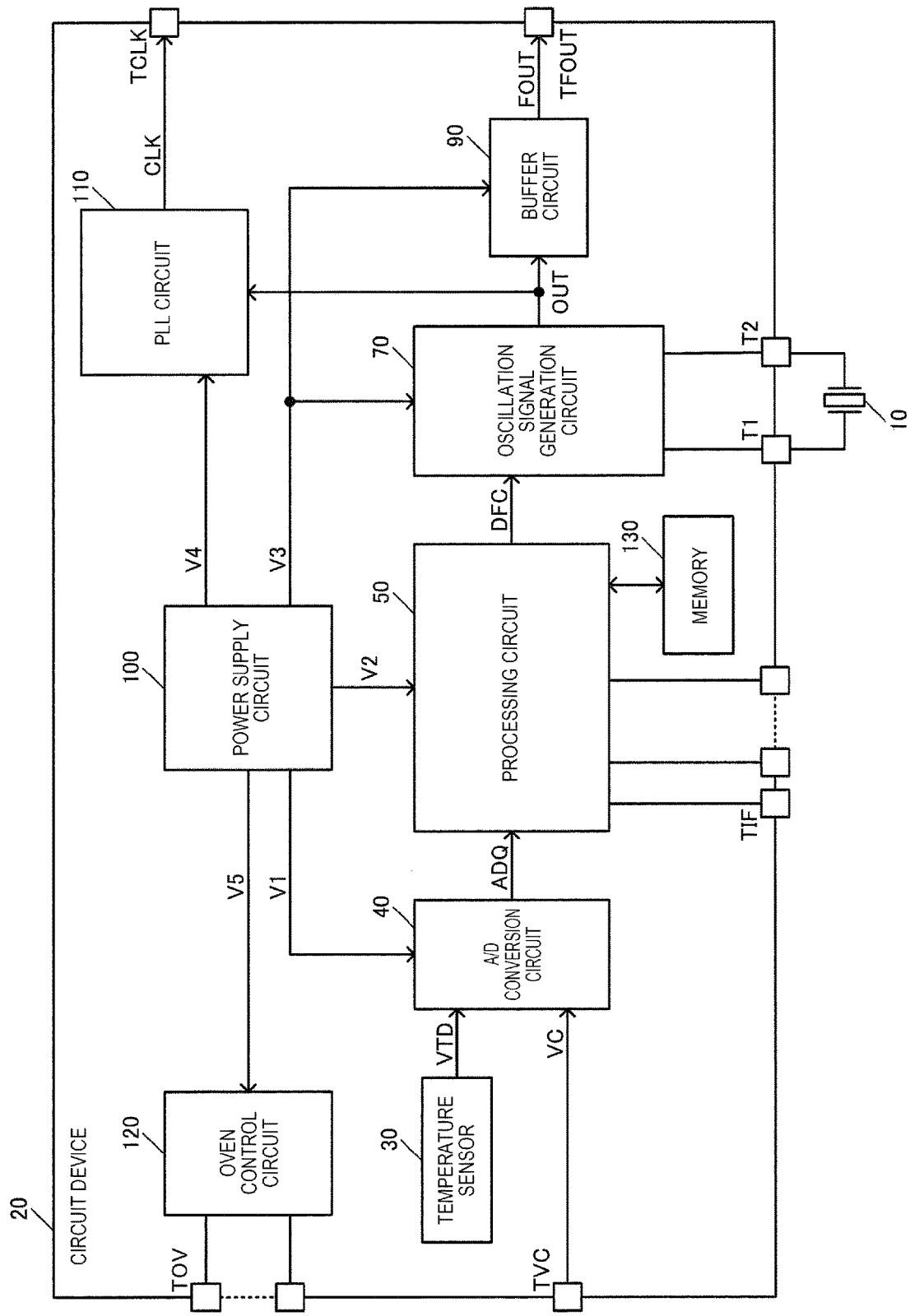
FIG. 10 is a detailed configuration example ref the circuit device of the present embodiment.

FIG. 10 shows a detailed configuration example of the circuit device 20. In FIG. 10, in addition to the configurations of FIG. 1 and FIG. 2, a buffer circuit 90, a power supply circuit 100, a PLL circuit 110, an oven control circuit 120, and a memory 130 are further provided.

The buffer circuit 90 buffers and outputs the oscillation signal OUT from the oscillation signal generation circuit 70. For example, the buffer circuit 90 outputs a signal obtained by buffering the oscillation signal OUT as an oscillation signal FOUT, to the outside via a terminal TFOUT of the circuit device 20.

For example, the oscillation signal FOUT of a CMOS waveform is outputted. Further, a clipped sine waveform may be outputted.

The power supply circuit 100 generates various power supply voltages used in circuit device 20. For example, various power supply voltages are generated based on an external power supply voltage inputted from a power supply terminal of the circuit device 20. For example, the power supply circuit 100 supplies a power supply voltage V1 to the A/D conversion circuit 40. The power supply circuit 100 supplies a power supply voltage V2 to the processing circuit 50 and supplies a power supply voltage V3 to the oscillation signal generation circuit 70. The power supply voltage V3 is also supplied to the buffer circuit 90, for example. The power supply circuit 100 also supplies power supply voltages V4 and V5 to the PLL circuit 110 and the oven control circuit 120. V1, V2, V3, V4, and V5 are a first power supply voltage, a second power supply voltage, a third power supply voltage, a fourth power supply voltage, and a fifth power supply voltage, respectively. For example, the power supply circuit 100 has a plurality of regulator circuits, and supplies voltages obtained by regulating the external power supply voltage by these regulator circuits, as the power supply voltages V1 to V5. In this manner, by branching and supplying the power supply voltage for each circuit block, power supply noise in one circuit block can be suppressed from being transmitted to other circuit blocks, and stable circuit operation can be realized.

The PLL circuit 110 generates and outputs a clock signal CLK obtained by multiplying the oscillation signal OUT. For example, the clock signal CLK, which is a frequency obtained by multiplying the frequency of the oscillation signal OUT and is synchronized in phase with the oscillation signal OUT, is output to the outside via a clock output terminal TCLK of the circuit device 20. As for the PLL circuit 110, for example, the fractional-N type PLL circuit as shown in FIG. 9 can be used. By providing such a PLL circuit 110, for example, an appropriate clock signal CLK as a clock signal used for an RF circuit or the like in a base station system can be generated and supplied. Further, if such a PLL circuit 110 is provided, for example, phase noise in a low frequency bandwidth can be reduced by the oscillation signal generation circuit 70 which is a clock signal generation circuit of a first stage, and phase noise in a high frequency band can be reduced by the PLL circuit 110 which is e clock signal generation circuit of a second stage. Accordingly, it is possible to generate the clean clock signal CLK with small phase noise in a wide frequency bandwidth ranging from the low frequency bandwidth to the high frequency bandwidth, and to supply the clean clock signal CLK by the RF circuit or the like of the base station.

The oven control circuit 120 controls the temperature of the resonator 10. For example, the oven control circuit 120 performs oven control of the oven type resonator 10 when the oven type resonator 10 provided in the thermostatic chamber is used. For example, the oven control circuit 120 performs the oven control of an oscillator by using a temperature sensor for the oven control realized by thermistor or the like. For example, if a resistance value of the thermistor as the temperature sensor changes according to an oven temperature of the oscillator, the oven control circuit 120 detects this change in the resistance value as a change in the temperature detection voltage. Then, a heater control voltage which changes according to the temperature detection voltage is generated and outputted via a terminal TOV for the oven control. The heater control voltage is output to a heater provided in the oscillator. The heater is constituted with, for example, a heating power bipolar transistor which is a heating element, and a base voltage of the heating power bipolar transistor is controlled by the heater control voltage, so that heating control of the heater is realized.

The memory 130 stores data used by the processing circuit 50. Specifically, the memory 130 stores the data used for the digital signal processing performed by the processing circuit 50. For example, when the processing circuit 50 performs the temperature compensation processing, the memory 130 stores the coefficient data for the temperature compensation. Further, when the processing circuit 50 performs the aging correction processing and the digital filter processing, the memory 130 stores data for the aging correction and coefficient data for the digital filter processing. The memory 130 can be realized by a nonvolatile memory such as metal-oxide-nitride-oxide-silicon (MONOS) and EEPROM. Further, the memory 130 may be a memory serving as a work area of the processing circuit 50. In this case, the memory 130 is realized by SRAM or the like.

Further, the circuit device 20 includes a digital interface terminal TIF electrically coupled to the processing circuit 50. The digital interface terminal TIF is a terminal for a digital interface circuit included in the processing circuit 50. For example, the digital interface circuit can be realized by an interface circuit of a two-wire inter-integrated circuit (I2C) method. The I2C method is a synchronous serial communication method which communicates with two signal lines of a serial clock line and a bidirectional serial data line. In this case, the digital interface terminal TIF is a terminal to which the serial clock line and the serial data lines are coupled. A plurality of slaves can be coupled to a bus of the I2C, and a master designates individually determined slave addresses, selects a slave, and then communicates with the slave. Alternatively, the digital interface circuit may be realized by an interface circuit of a 3-wire or 4-wire serial peripheral interface (SPI) method. The SPI method is a synchronous serial communication method which communicates with the serial clock line and two unidirectional serial data lines. In this case, the digital interface terminal TIF is the terminal to which the serial clock line and the serial data lines are coupled. A plurality of slaves can be coupled to the SPI bus, but in order to designate them, the master needs to select a slave using a slave select line and in this case, the slave select line is required.

2. Layout Disposition

Figure 11:
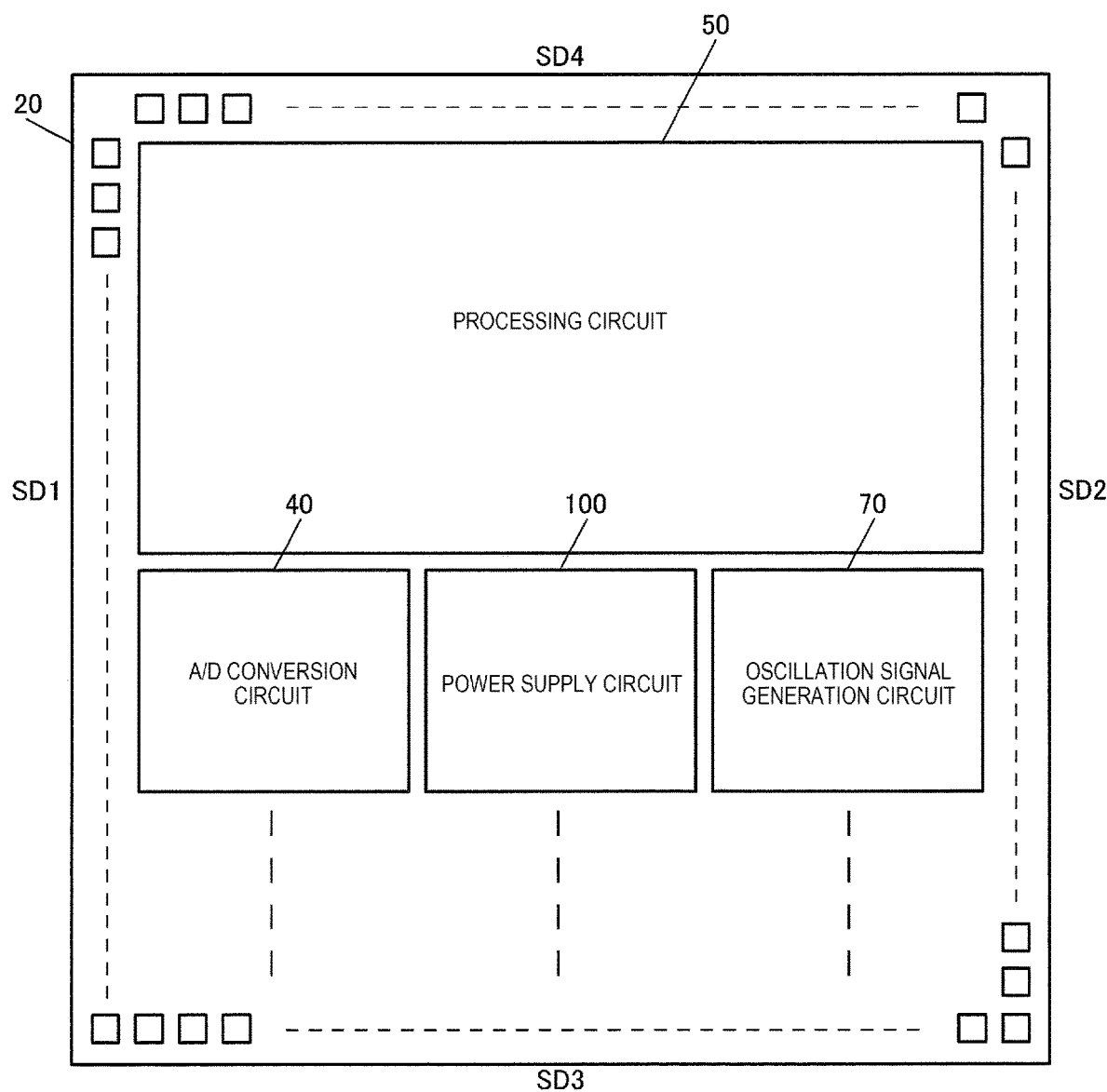
FIG. 11 is a layout disposition example of a circuit device of the present embodiment.

FIG. 11 shows a layout disposition example of the circuit device 20 of the present embodiment. The circuit device 20 has sides SD1, SD2, SD3, and SD4. That is, the circuit device 20 includes the side SD1, the side SD2 opposite to the side SD1, the side SD3 crossing the side SD1, and side SD4 opposite to the side SD3. A rectangular shape is formed by these sides SD1, SD2, SD3 and SD4. The sides SD1, SD2, SD3, and SD4 are a first side, a second side, a third side, and a fourth side, respectively. For example, the side SD1 and the side SD2 are sides opposed to each other, and the sides SD3, and SD4 are orthogonal to the sides SD1 and SD2 and opposed to each other. A direction from the side SD1 to the side SD2 is defined as DR1, and a direction from the side SD3 to the side SD4 is defined as DR2. Further, an opposite direct of DR2 is defined as DR3, and an opposite direction of DR1 is defined as DR4. The directions DR1, DR2, DR3, and DR4 are a first direction, a second direction, a third direction, and a fourth direction, respectively.

In this case, in FIG. 11, the oscillation signal generation circuit 70 is disposed on the direction DR1 side which is the first direction side of the A/D conversion circuit 40. The processing circuit 50 is disposed on the direction DR2 side which is the second direction side of the A/D conversion circuit 40 and the oscillation signal generation circuit 70. The direction DR2 is a direction orthogonal to the direction DR1. For example, the A/D conversion circuit 40 and the processing circuit 50 are disposed adjacent to each other along the direction DR2, and the oscillation signal generation circuit 70 and the processing circuit 50 are also disposed adjacent to each other along the direction DR2. Disposition in which two circuit blocks are disposed adjacent to each other means that no other circuit block is interposed between the two circuit blocks in the disposition. Further, the A/D conversion circuit 40 is disposed at a position having a shorter distance from the side SD1 compared to a distance from the side SD2. On the other hand, the oscillation signal generation circuit 70 is disposed at a position having a shorter distance from the side SD2 compared to a distance from the side SD1. For example, an area between a center line of the side SD1 and the side SD2, and the side SD1 is defined as a first area, and an area between the center line and the side SD2 is set as a second area. In this case, the A/D conversion circuit 40 is disposed in the first area on the side SD1 side and the oscillation signal generation circuit 70 is disposed in the second area on the side SD2 side.

According to such a layout disposition, the A/D conversion data from the A/D conversion circuit 40 can be input to the processing circuit 50 via a short-path wiring path. For example, the A/D conversion circuit 40 A/D-converts the control voltage VC, outputs the control voltage data DVC to the processing circuit 50, A/D-converts the temperature detection voltage VTD, and outputs the temperature detection data DTD to the processing circuit 50. By using the layout disposition shown in FIG. 11, the control voltage data DVC and the temperature detection data DTD can be input to the processing circuit 50 via the short-path wiring path. The frequency control data DFC from the processing circuit 50 can also be input to the oscillation signal generation circuit 70 via the short-path wiring path. For example, in the first configuration example of FIG. 1 and FIG. 7, it is possible to input the frequency control data DFC from the processing circuit 50 to the D/A conversion circuit 72 via the short-path wiring path and perform the D/A conversion. On the other hand, in the second configuration example of FIGS. 2 and 8, the frequency control data DFC from the processing circuit 50 can be input to the dividing circuit 83 of the fractional-N type PLL circuit 82 via the short-path wiring path, and the division ratio can be set.

As a result, the A/D conversion circuit 40, the processing circuit 50, and the oscillation signal generation circuit 70 can be compactly and efficiently laid out and disposed as shown in FIG. 11, and an area of the circuit device 20 can be reduced. It is also possible to minimize a signal delay of data transfer between the A/D conversion circuit 40 and the processing circuit 50 and the signal delay of the data transfer between the processing circuit 50 and the oscillation signal generation circuit 70, and an occurrence of a defect in the circuit operation due to the signal delay, or the like can be prevented.

In FIG. 11, the power supply circuit 100 is disposed between the A/D conversion circuit 40 and the oscillation signal generation circuit 70. For example, the A/D conversion circuit 40 and the power supply circuit 100 are disposed adjacent to each other along the direction DR1, and the power supply circuit 100 and the oscillation signal generation circuit 70 are also disposed adjacent to each other along the direction DR1.

With such a layout disposition, a space between the A/D conversion circuit 40 and the oscillation signal generation circuit 70 can be effectively utilized, and the power supply circuit 100 can be disposed. For example, since the processing circuit 50 which is a logic circuit performs various digital signal processing, a circuit area thereof becomes large. Therefore, when the processing circuit 50 is disposed on the direction DR2 side of the A/D conversion circuit 40 and the oscillation signal generation circuit 70, there is a problem that an empty space is generated in an area of the direction DR3 side which is the third direction side of the processing circuit 50, and an area between the A/D conversion circuit 40 and the oscillation signal generation circuit 70. In this respect, since the power supply circuit 100 is disposed in the area in which the empty space is formed in FIG. 11, the A/D conversion circuit 40, the processing circuit 50, the oscillation signal generation circuit 70, and the power supply circuit 100 can be compactly and efficiently laid out and disposed, and the area of the circuit device 20 can be further reduced.

As described in FIG. 10, the power supply circuit 100 supplies the power supply voltage V1 to the A/D conversion circuit 40 and supplies the power supply voltage V2 to the processing circuit 50. Further, the power supply circuit 100 supplies the power supply voltage V3 to the oscillation signal generation circuit 70. For example, the power supply voltage V1 is supplied from the power supply circuit 100 to the A/D conversion circuit 40 by a first power supply line wired along the direction DR4. Further, the power supply voltage V2 is supplied from the power supply circuit 100 to the processing circuit 50 by a second power supply line wired along the direction DR2. Further, the power supply voltage V3 is supplied from the power supply circuit 100 to the oscillation signal generation circuit 70 by a third power supply line wired along the direction DR1. In this way, the power supply voltages V1, V2, and V3 can be supplied from the power supply circuit 100 to the A/D conversion circuit 40, the processing circuit 50, and the oscillation signal generation circuit 70 by the first, second, and third power supply lines having short wiring lengths.

For example, since the processing circuit 50 performs the digital signal processing at a high clock frequency, the digital signal processing causes digital noise with a high noise level to occur. If the digital noise is transmitted to the A/D conversion circuit 40 and the oscillation signal generation circuit 70, a problem occurs in which performance of an analog circuit deteriorates, or the like. For example, problems occur in which an A/D conversion accuracy degrades, the digital noise with the high noise level is superimposed on an oscillation signal, or the like. In this regard, in the present embodiment, the power supply voltages V1 and V3 generated separately from the power supply voltage V2 supplied to the processing circuit 50 are supplied to the A/D conversion circuit 40 and the oscillation signal generation circuit 70. For example, the power supply voltages V1 and V3 can be supplied to the A/D conversion circuit 40 and the oscillation signal generation circuit 70 by using the first power supply line and the third power supply line which are different from the second power supply line which is from the power supply circuit 100 to the processing circuit 50. Therefore, the problem of the deterioration of the performance caused by the digital noise of the processing circuit 50 can be prevented.

Figure 12:
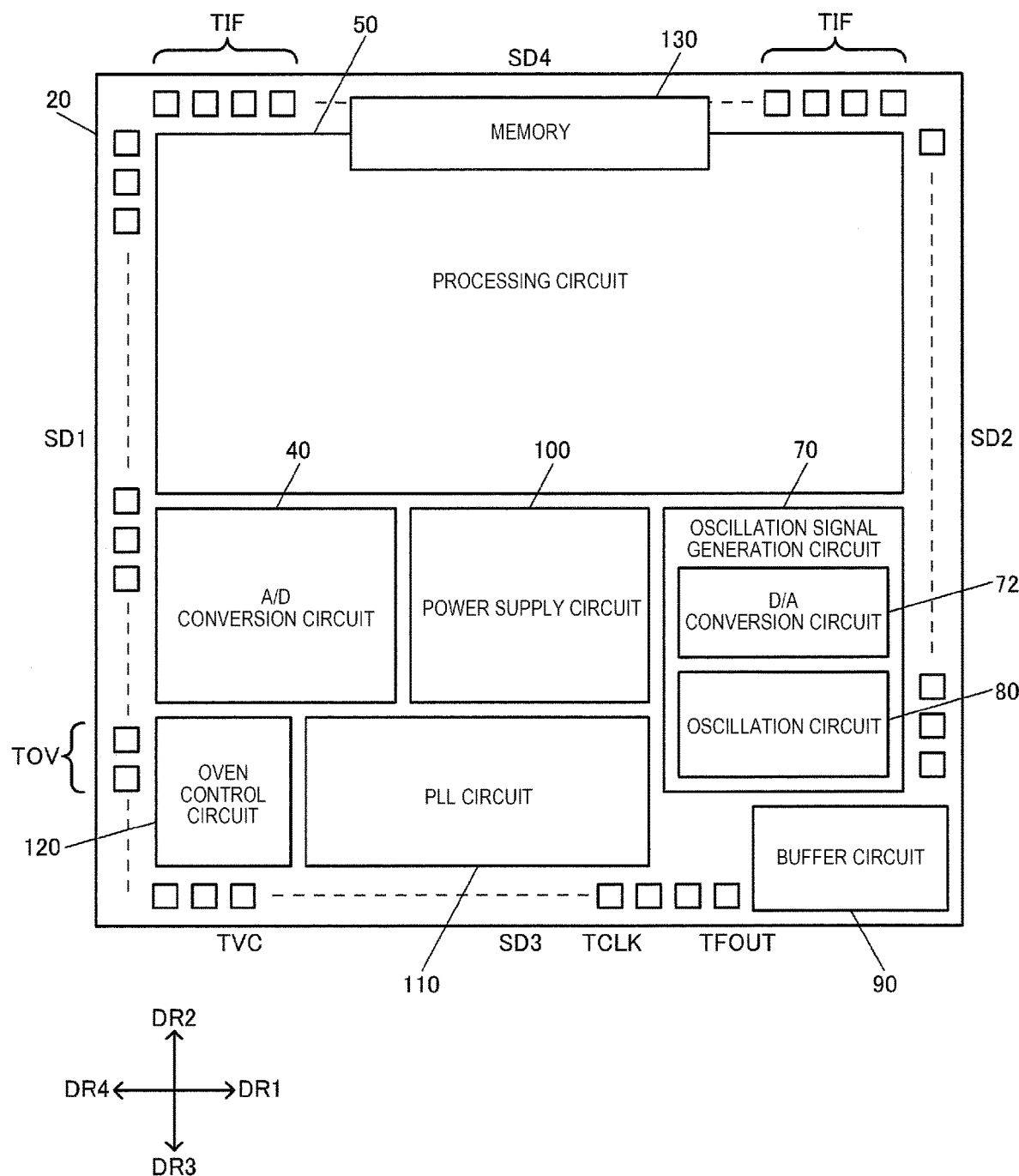
FIG. 12 is a detailed layout disposition example of circuit device of the present embodiment.

FIG. 12 shows a detailed layout disposition example of the circuit device of the present embodiment. As shown in FIG. 12, the circuit device 20 includes the memory 130 storing data which the processing circuit 50 uses. As described with reference to FIG. 10, the memory 130 stores the various coefficient data or the like used for the digital signal processing performed by the processing circuit 50. For example, the coefficient data for the temperature compensation processing, the coefficient data for the digital filter processing, or the like are stored. The memory 130 is disposed between the processing circuit 50 and the side SD4 of the circuit device 20. For example, in FIG. 12, the memory 130 is disposed corresponding to a position on a side of the processing circuit 50 on the side SD4 side. For example, the memory 130 is disposed to overlap an I/O area along the side SD4.

According to such a layout disposition, the memory 130 can be disposed using a space on the side of the processing circuit 50 on the SD4 side. For example, it is possible to dispose the memory 130 by effectively using the space for the I/O area along the side SD4. Therefore, the memory 130 storing data used for the processing circuit 50 can be efficiently laid out and disposed, and scale of the circuit device 20 can be reduced or the like. Further, the coefficient data or the like read from the memory 130 can be inputted to the processing circuit 50 through the short-path wiring path. Further, for example, when the memory 130 is a nonvolatile memory, a high voltage power supply for writing and reading data is required, but it is also possible to dispose a high voltage power supply terminal, for supplying the high voltage power supply to the circuit device 20 from the outside, in the I/O area along the side SD4.

Further, the circuit device 20 includes the digital interface terminal TIF electrically coupled to the processing circuit 50. As described in FIG. 10, the digital interface terminal TIF is a clock terminal and a data terminal in the I2C and the SPI. As shown in FIG. 12, the digital interface terminal TIF is disposed between the processing circuit 50 and the side SD4. For example, the digital interface terminal TIF is disposed in the I/O area along the side SD4. For example, the A/D conversion circuit 40, the power supply circuit 100, tie oscillation signal generation circuit 70, the buffer circuit 90, or the like are disposed on the direction DR3 side of the processing circuit 50, while the digital interface terminal TIF is disposed on the side of the direction DR2 opposite to the direction DR3.

For example, in the digital interface terminal TIF, the digital noise with the high noise level is generated by the clock signal or the data signal of the I2C and the SPI. When the digital noise is transmitted to the A/D conversion circuit 40, a problem such as degradation of the A/D conversion accuracy is caused. Further, when the digital noise is transmitted to the oscillation signal generation circuit 70 and the buffer circuit 90, the digital noise is superimposed on the oscillation signal, causing problems such as degradation in accuracy of the oscillation frequency and increase in the phase noise. In this regard, in FIG. 12, the digital interface terminal TIF which is a source of the digital noise is disposed between the processing circuit 50 and the side SD4, and is disposed on the direction DR2 side of the processing circuit 50. Therefore, the distance between the digital interface terminal TIF and the A/D conversion circuit 40 can be increased, and the distance between the digital interface terminal TIF, and the oscillation signal generation circuit 70 and the buffer circuit 90 can be increased. Therefore, the degradation of the A/D conversion accuracy due to the digital noise can be suppressed. Further, the degradation of the accuracy of the oscillation frequency and the increase of the phase noise due to the digital noise can be suppressed.

The circuit device 20 also includes the buffer circuit 90 which buffers the oscillation signal and outputs the signal to the outside. As shown in FIG. 12, the buffer circuit 90 is disposed on the direction DR3 side of the oscillation signal generation circuit 70. For example, the oscillation signal generation circuit 70 is disposed on the direction DR3 side of the processing circuit 50, and the buffer circuit 90 is disposed on the direction DR3 side of the oscillation signal generation circuit. For example, the oscillation signal generation circuit 70 and the buffer circuit 90 are disposed adjacent to each other along the direction Specifically, in FIG. 12, he buffer circuit 90 is disposed in a corner area in which the side SD2 and the side SD3 cross each other. Further, the terminal TFOUT from which the oscillation signal is outputted is disposed on the direction DR4 side of the buffer circuit 90 in the I/O area along the side SD3.

According to such a layout disposition, the buffer circuit 90 outputting the oscillation signal can be disposed at a position which is a maximum distance away from the processing circuit 50 and the digital interface terminal TIF. For example, the terminal TFOUT from which the oscillation signal is outputted can be disposed in an area of the side SD3 opposed to an area of the side SD4 in which the digital interface terminal TIF is disposed. Accordingly, the digital noise generated in the processing circuit 50 and the digital interface terminal TIF can be suppressed from being superimposed on the oscillation signal. Therefore, due to the digital noise, an occurrence of the problems such as the degradation of the accuracy of the oscillation frequency and the increase of the phase noise of the oscillation signal can be suppressed. Further, by disposing the buffer circuit 90 so as to be adjacent to the direction DR3 side of the oscillation signal generation circuit 70, it is possible to couple a signal line with the oscillation signal from the oscillation signal generation circuit 70 to the buffer circuit 90 via a short path, and degradation of performance caused by a parasitic capacitance of the signal line or the like can be suppressed.

The resonator 10 of the present embodiment also includes the oven control circuit 120 which controls the temperature of the resonator 10. As shown in FIG. 12, the oven control circuit 120 is disposed on the direction DR3 side of the A/D conversion circuit 40. For example, in FIG. 12, the A/D conversion circuit 40 and the oven control circuit 120 are disposed in the first area close to the side SD1 and in an area on the direction DR3 side of the processing circuit 50, and the oscillation signal generation circuit 70 and the buffer circuit 90 are disposed in the second area close to the side SD2. In this way, the A/D conversion circuit 40 and the oven control circuit 120, and the oscillation signal generation circuit 70 and the buffer circuit 90 can be disposed by effectively utilizing a space on the direction DR3 side of the processing circuit 50. Accordingly, it is possible to enable an efficient layout disposition of these circuit blocks, and reduction in the layout area of the circuit device 20, or the like can be realized.

The circuit device 20 also includes the PLL circuit 110 which generates and outputs a clock signal obtained by multiplying the oscillation signal. The PLL circuit 110 is disposed on the direction DR3 side of the A/D conversion circuit 40. For example, the PLL circuit 110 is disposed on the direction DR3 side of the A/D conversion circuit 40 and the power supply circuit 100. Specifically, the PLL circuit 110 is disposed between the oven control circuit 120 and the buffer circuit 90. In this way, the PLL circuit 110 can be disposed by effectively utilizing a space on the direction DR3 side of the A/D conversion circuit 40. Further, for example, the PLL circuit 110 can be disposed on the direction DR4 side of the oscillation signal generation circuit 70, and the signal line with the oscillation signal from the oscillation signal generation circuit 70 can be coupled to the PLL circuit 110 via the short path.

As described with reference to FIG. 10, the power supply circuit 100 generates the power supply voltage V4 and supplies the voltage to the PLL circuit 110. For example, the power supply voltage V4 is supplied from the power supply circuit 100 to the PLL circuit 110 via the fourth power supply line wired along the direction DR3.

The PLL circuit 110 may also be the fractional-N type PLL circuit 82 described in FIG. 9. For example, in a first operation mode of the circuit device 20, the oscillation signal OUT is generated by the D/A conversion circuit 72, the variable capacitor 74, and the oscillation circuit 80 as in the first configuration example of FIG. 1. Then, as shown in FIG. 10, the PLL circuit 110 which is the fractional-N type PLL circuit 82 generates and outputs the clock signal CLK obtained by multiplying the oscillation signal OUT. In this case, the clock output terminal. TCLK from which the clock signal CLK is outputted is disposed in the I/O area along the side SD3, for example. The control voltage input terminal TVC to which the control voltage VC is inputted is also disposed in the I/O area along the side SD3. On the other hand, in a second operation mode of the circuit device 20, an oscillation signal OUT is generated by the oscillation circuit 80 and the fractional-N type PLL circuit 82 which is the PLL circuit 110 as in the second configuration example of FIG. 2. Accordingly, the operation of the circuit device 20 in various operation modes is possible.

3. Oscillation Circuit

Figure 13:
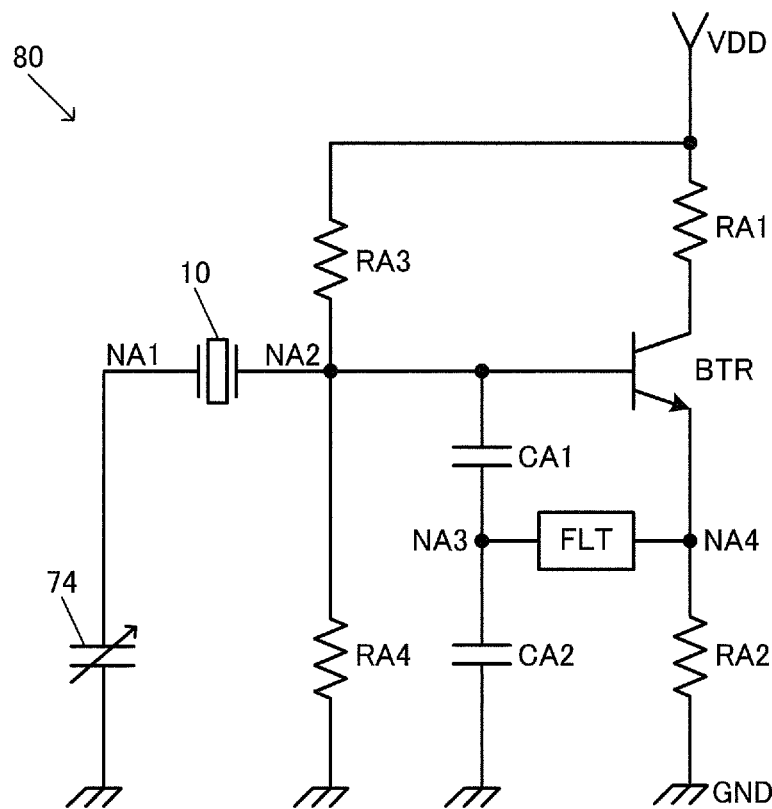
FIG. 13 shows a configuration example of an oscillation circuit.

FIG. 13 shows a configuration example of the oscillation circuit 80. FIG. 13 shows an example of the oscillation circuit 80 of a Colpitts type. The variable capacitor 74 is provided between the node NA1 at one end of the resonator 10 and the GND node. The node NA2 of the other end of the resonator 10 is coupled to a base of a bipolar transistor BTR. A resistor RA1 is provided between a VDD node which is a power supply node on the high potential side and the collector of the bipolar transistor BTR, and a resistor RA2 is provided between the emitter of the bipolar transistor BTR and the GND node. A resistor RA3 is provided between the VDD node and the node NA2, and a resistor RA4 is provided between the node NA2 and the GND node. Capacitors CA1 and CA2 are provided in series between the node NA2 and the GND node, and a filter FLT is provided between a coupling node NA3 of the capacitors CA1 and CA2 and a node NA4 of the emitter of the bipolar transistor BTR. The oscillation circuit 80 is not limited to the configuration of FIG. 13, and various modifications such as different coupling configurations are possible. Further, an oscillation circuit such as a Pierce type may be used as the oscillation circuit 80.

4. Oscillator

Figure 14:
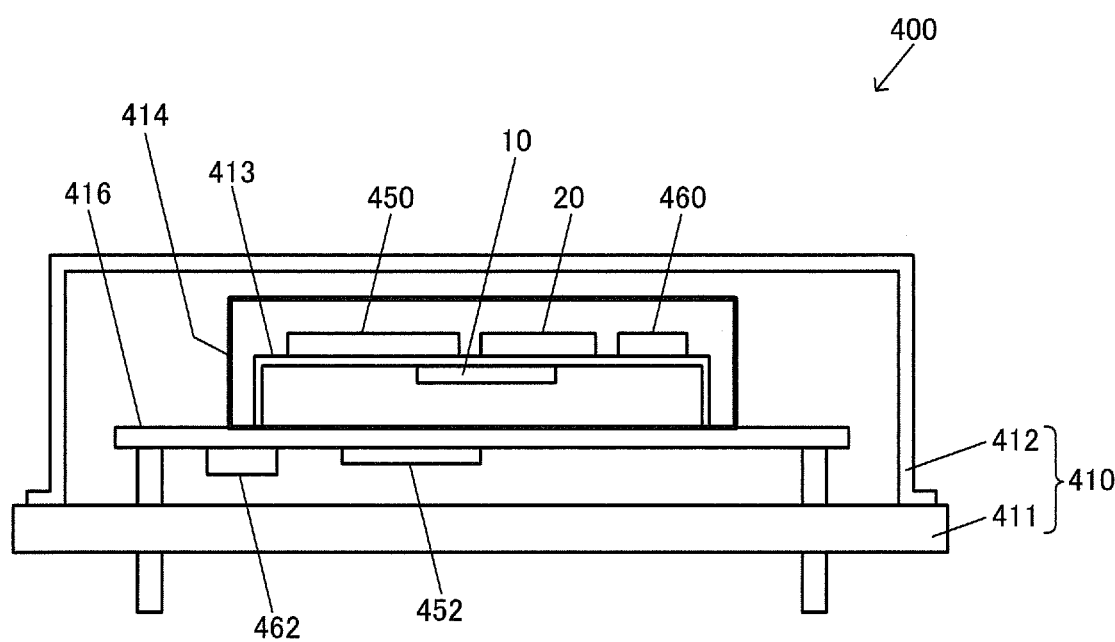
FIG. 14 is a configuration example of an oscillator.

FIG. 14 shows a configuration example of an oscillator 400 including the circuit device 20 of the present embodiment. As shown in FIG. 14, the oscillator 400 includes the resonator 10 and the circuit device 20. The resonator 10 and the circuit device 20 are mounted in a package 410 of the oscillator 400. The terminal of the resonator 10 and the pad of the IC which is the terminal of the circuit device 20 are electrically coupled by internal wiring of the package 410. In FIG. 14, the oscillator 400 is an oscillator of an oven structure. Specifically, the oscillator has a double oven structure.

The package 410 is constituted with a substrate 411 and a case 412. Various electronic components (not shown) are mounted on the substrate 411. A second container 414 is provided inside the case 412, and a first container 413 is provided inside the second container 414. The resonator 10 is mounted on an inner surface of an upper surface of the first container 413. Further, the circuit device 20, a heater 450, and a temperature sensor 460 of the present embodiment are mounted on an outer surface of the upper surface of the first container 413. The heater 450 which is a heating element can adjust a temperature inside the second container 414, for example.

The temperature sensor 460 can detect the temperature inside the second container 414, for example.

The second container 414 is provided on a substrate 416. The substrate 416 is a circuit substrate on which various electronic components can be mounted. A heater 452 and a temperature sensor 462 are mounted on a back side of a surface of the substrate 416 on which the second container 414 is provided. For example, the heater 452 which is a heating element can adjust a temperature in a space between the case 412 and the second container 414. The temperature sensor 462 can detect the temperature in the space between the case 412 and the second container 414.

As for heating elements of the heaters 450 and 452, for example, a heating power bipolar transistor, a heating heater MOS transistor, a heating resistor, a Peltier element or the like can be used. Control of heating of the heaters 450 and 452 can be realized by the oven control circuit 120 of the circuit device 20, for example. A thermistor, a diode, or the like can be used as the temperature sensors 460 and 462, for example. In this way, FIG. 15, the temperature sensors 460 and 462 are provided outside the circuit device 20, and the A/D conversion circuit 40 A/D-converts the temperature detection voltage from the external temperature sensors 460 and 462. In this case, both the temperature sensor 30 inside the circuit device 20 and the external temperature sensors 460 and may be used in combination. In FIG. 14, since temperature adjustment of the resonator 10 or the like can be realized in the thermostatic chamber having the double oven structure, it is possible to stabilize the oscillation frequency of the resonator 10, or the like.

Although FIG. 14 shows the configuration example of the double oven structure, the oscillator 400 of the present embodiment is not limited to such a configuration, and various modifications are possible. For example, the oscillator 400 may have a single oven structure. That is, in FIG. 14, although two containers are provided as the first and second containers 413 and 414, the oscillator 400 may have the single oven structure in which one container is provided as the thermostatic chamber.

5. Electronic Apparatus and Vehicle

Figure 15:
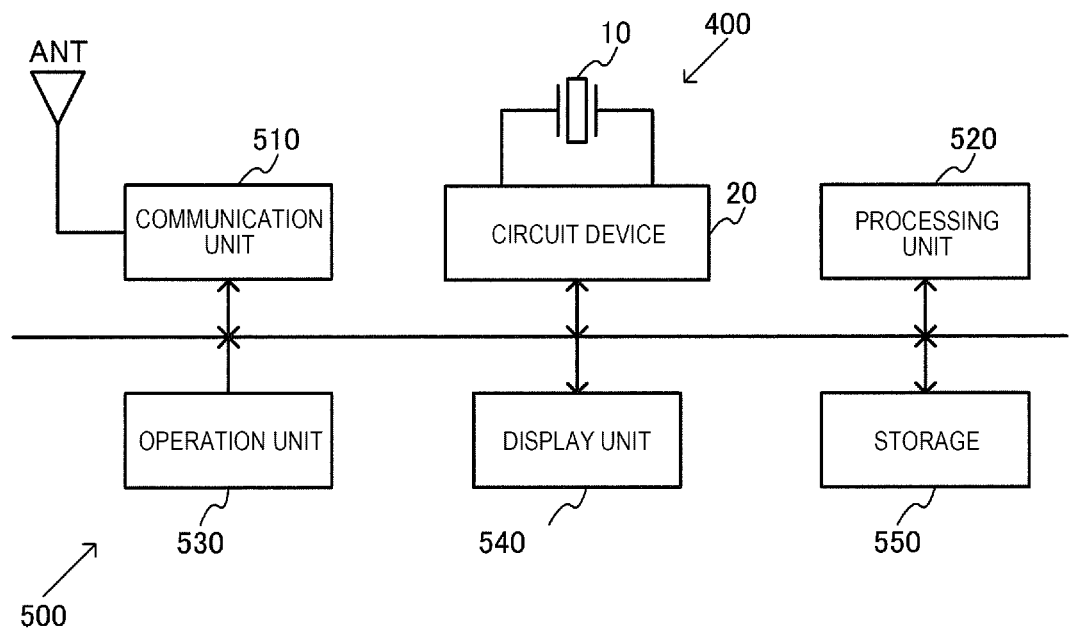
FIG. 15 is a configuration example of electronic apparatus.

FIG. 15 shows a configuration example of electronic apparatus 500 including the circuit device 20 of the present embodiment The electronic apparatus 500 includes the circuit device 20, the resonator 10, and a processing unit 520 of the present embodiment. The electronic apparatus 500 can include an antenna ANT, a communication unit 510, an operation unit 530, a display unit 540, and a storage 550. The resonator 10 and the circuit device 20 constitute the oscillator 400. Note that the electronic apparatus 500 is riot limited to the configuration of FIG. 15, and various modifications such as omitting some constituent elements thereof and adding other constituent elements are possible.

The electronic apparatus 500 is, for example, a network-related apparatus such as a base station or a router, highly accurate measurement apparatus which measures physical quantities such as distance, time, flow speed, or flow rate, biological information measurement apparatus which measures biological information, in-vehicle apparatus, or the like. The biological information measurement apparatus is, for example, an ultrasonic measuring device, a pulse wave meter, a blood pressure measuring device or the like. The in-vehicle apparatus is apparatus for automatic operation, or the like. Further, the electronic apparatus 500 may be wearable apparatus such as a head mounted display device and timepiece related apparatus, a portable information terminal such as a robot, a printing device, a projection device, and a smartphone, content providing apparatus which distributes content, or video apparatus such as a digital camera or a video camera, or the like.

The communication unit 510 which is a communication interface performs processing such as receiving data from the outside via the antenna ANT and transmitting the data to the outside. The processing unit 520 which is a processor performs control processing of electronic apparatus 500, various digital processing of data transmitted and received via the communication unit 510, or the like. A function of the processing unit 520 can be realized by a processor such as a microcomputer, for example. The operation unit 530 which is an operation interface is for a user to perform an input operation and can be realized by an operation button, a touch panel display, or the like. The display unit 540 displays various types of information and can be realized by a display such as liquid crystal and organic EL. The storage 550 stores data, and a function thereof can be realized by a semiconductor memory such as RAM and ROM, HDD, or the like.

Figure 16:
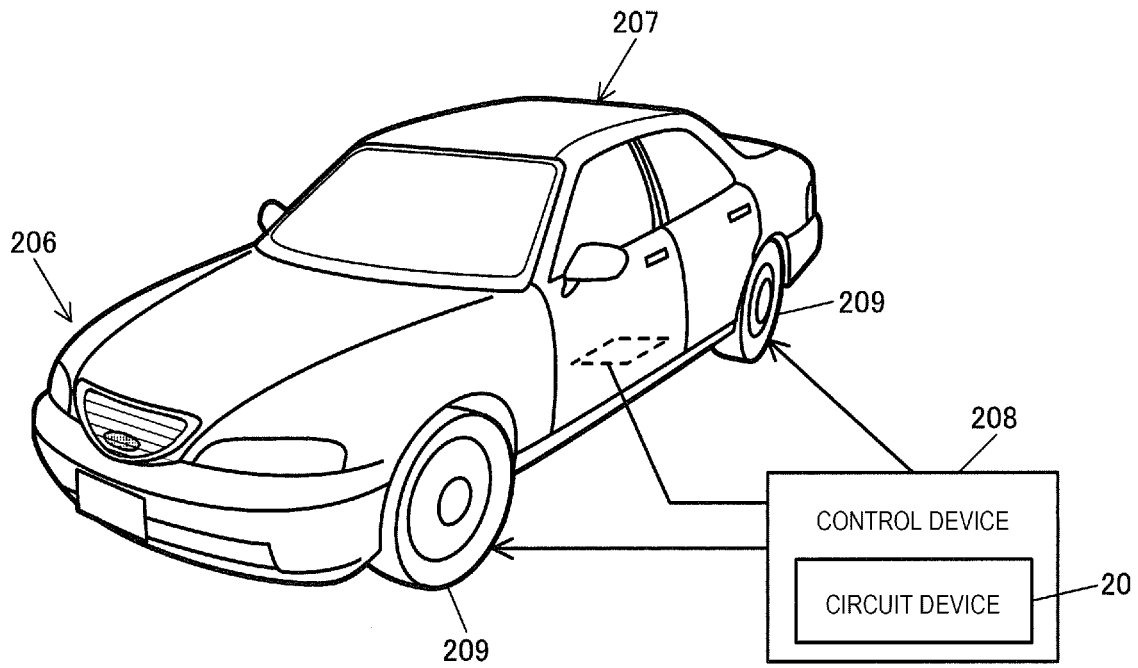
FIG. 16 is a configuration example of a vehicle.

FIG. 16 shows an example of a vehicle including the circuit device 20 of the present embodiment. The circuit device 20 of the present embodiment can be incorporated into various vehicles such as a car, an airplane, a motorcycle, a bicycle, or a ship. The vehicle is apparatus or a device which includes a drive mechanism such as an engine and a motor, a steering mechanism such as a steering wheel and a rudder, and various electronic apparatus and which moves on the ground, the sky, and the sea. FIG. 16 schematically shows an automobile 206 as a specific example of the vehicle. The circuit device 20 of the present embodiment and an oscillator (not shown) having a resonator are incorporated in the automobile 206. A control device 208 operates by a clock signal generated by the oscillator. The control device 208, for example, controls hardness of a suspension according to a position of a car body 207, and controls brakes of individual wheels 209. For example, automatic operation of the automobile 206 may be realized by the control device 208. Note that apparatus incorporating the circuit device 20 and the oscillator of the present embodiment is not limited to such a control device 208 but can be incorporated in various apparatus provided in the vehicle such as the automobile 206.

Although the present embodiment has been described in detail as above, it will be readily understood by those skilled in the art that many modifications are possible that do not deviate practically from the novel matters and effects of the present disclosure. Therefore, all such modifications are included in the scope of the present disclosure. For example, in the specification or the drawings, at least once, a term described together with a different term which is broader or equivalent can be replaced with the different term at any point in the specification or the drawings. Further, all combinations of the present embodiment and modifications are also included in the scope of the present disclosure. Further, the configuration and operation of the circuit device, the electronic apparatus, and the vehicle, and the A/D conversion processing, the temperature compensation processing, the addition processing, the generation processing of the frequency control data, the layout disposition of the circuit device, and the coupling configuration, or the like is not limited to those described in the present embodiment, and various modifications can be made.

The entire disclosure of Japanese Patent Application No. 2018-082716, filed Apr. 24, 2018 is expressly incorporated by reference herein.

What is claimed is:

1. A circuit device comprising:
an A/D conversion circuit that receives a control voltage and generates control voltage data, and receives a temperature detection voltage from a temperature sensor and generates temperature detection data;
a processing circuit that generates temperature compensation data based on the temperature detection data, and generates frequency control data by performing addition processing of the temperature compensation data and the control voltage data; and
an oscillation signal generation circuit that generates an oscillation signal of an oscillation frequency set by the frequency control data, using the frequency control data and a resonator,
wherein the processing circuit performs correction processing on addition result data of the addition processing and outputs the frequency control data after the correction processing.

2. The circuit device according to claim 1, wherein the oscillation signal generation circuit includes
a D/A conversion circuit that receives the frequency control data after the correction processing and outputs a capacitance control voltage,
a variable capacitor whose capacitance is controlled based on the capacitance control voltage, and
an oscillation circuit that oscillates the resonator with the capacitance of the variable capacitor as a load capacitance to generate the oscillation signal.

3. The circuit device according to claim 1, wherein the processing circuit performs conversion processing on the addition result data of the addition processing and outputs division ratio data as the frequency control data after the conversion processing, and
the oscillation signal generation circuit includes
an oscillation circuit that oscillates the resonator to generate a second oscillation signal, and
a fractional-N type PLL circuit having a dividing circuit in which a division ratio is set based on the division ratio data, comparing phases of a frequency division clock signal from the dividing circuit and the second oscillation signal, and generating the oscillation signal.

4. The circuit device according to claim 1, wherein the circuit device has a first side, a second side opposite to the first side, a third side crossing the first side, and a fourth side opposite to the third side, and
when a direction from the first side to the second side is defined as a first direction and a direction from the third side to the fourth side is defined as a second direction,
the oscillation signal generation circuit is disposed on the first direction side of the A/D conversion circuit,
the processing circuit is disposed on the second direction side of the A/D conversion circuit and the oscillation signal generation circuit,
the A/D conversion circuit is disposed at a position having a shorter distance from the first side compared to a distance from the second side, and
the oscillation signal generation circuit is disposed at a position having a shorter distance from the second side compared to a distance from the first side.

5. The circuit device according to claim 4, wherein a power supply circuit is disposed between the A/D conversion circuit and the oscillation signal generation circuit.

6. The circuit device according to claim 5, wherein the power supply circuit supplies a first power supply voltage to the A/D conversion circuit, supplies a second power supply voltage to the processing circuit, and supplies a third power supply voltage to the oscillation signal generation circuit.

7. The circuit device according to claim 4, further comprising a memory storing data to be used by the processing circuit, wherein the memory is disposed between the processing circuit and the fourth side.

8. The circuit device according to claim 4, further comprising a digital interface terminal electrically coupled to the processing circuit, wherein the digital interface terminal is disposed between the processing circuit and the fourth side.

9. The circuit device according to claim 4, further comprising a buffer circuit buffering the oscillation signal and outputting the oscillation signal to an outside, wherein when an opposite direction of the second direction is defined as a third direction, the buffer circuit is disposed on the third direction side of the oscillation signal generation circuit.

10. The circuit device according to claim 4, further comprising an oven control circuit controlling a temperature of the resonator, wherein when an opposite direction of the second direction is defined as a third direction, the oven control circuit is disposed on the third direction side of the A/D conversion circuit.

11. The circuit device according to claim 4, further comprising a PLL circuit generating and outputting a clock signal obtained by multiplying the oscillation signal, wherein when an opposite direction of the second direction is defined as a third direction, the PLL circuit is disposed on the third direction side of the A/D conversion circuit.

12. A circuit device comprising:
an A/D conversion circuit that receives a control voltage and generates control voltage data, and A/D converts a temperature detection voltage received from a temperature sensor to output temperature detection data;
a processing circuit that generates temperature compensation data based on the temperature detection data, performs addition processing of the temperature compensation data and the control voltage data, and performs temperature compensation processing of an oscillation frequency based on the temperature detection data, to generate and output frequency control data of the oscillation frequency; and
an oscillation signal generation circuit generating an oscillation signal of the oscillation frequency set by the frequency control data, using the frequency control data and a resonator, wherein
the processing circuit performs correction processing on addition result data of the addition processing and outputs the frequency control data after the correction processing,
the circuit device has a first side, a second side opposite to the first side, a third side crossing the first side, and a fourth side opposite to the third side, and
when a direction from the first side to the second side is defined as a first direction and a direction from the third side to the fourth side is defined as a second direction,
the oscillation signal generation circuit is disposed on the first direction side of the A/D conversion circuit,
the processing circuit is disposed on the second direction side of the A/D conversion circuit and the oscillation signal generation circuit,
the A/D conversion circuit is disposed at a position having a shorter distance from the first side compared to a distance from the second side, and
the oscillation signal generation circuit is disposed at a position having a shorter distance from the second side compared to a distance from the first side.

13. An oscillator comprising
the circuit device according to claim 1, and
the resonator.

14. An electronic apparatus comprising the circuit device according to claim 1.

15. A vehicle comprising the circuit device according to claim 1.

* * * * *